US012426459B2

(12) United States Patent
Cheng et al.

(10) Patent No.: US 12,426,459 B2
(45) Date of Patent: Sep. 23, 2025

(54) DISPLAY SUBSTRATE, METHOD OF MANUFACTURING THE DISPLAY SUBSTRATE, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Bo Cheng, Beijing (CN); Jie Gou, Beijing (CN); Mengmeng Du, Beijing (CN); Jun Yan, Beijing (CN); Bo Zhang, Beijing (CN); Yixiang Yang, Beijing (CN); Zhenhua Zhang, Beijing (CN); Hongwei Ma, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 442 days.

(21) Appl. No.: 17/787,986

(22) PCT Filed: Aug. 4, 2021

(86) PCT No.: PCT/CN2021/110548
§ 371 (c)(1),
(2) Date: Jun. 22, 2022

(87) PCT Pub. No.: WO2022/052681
PCT Pub. Date: Mar. 17, 2022

(65) Prior Publication Data
US 2023/0045292 A1 Feb. 9, 2023

(30) Foreign Application Priority Data
Sep. 10, 2020 (CN) .......................... 202010950350.X

(51) Int. Cl.
*H01L 21/78* (2006.01)
*G09G 3/00* (2006.01)
(Continued)

(52) U.S. Cl.
CPC ........... *H10K 59/131* (2023.02); *G09G 3/006* (2013.01); *H10D 86/441* (2025.01); *H10D 86/60* (2025.01);
(Continued)

(58) Field of Classification Search
CPC ............. H10K 59/131; H10K 59/1213; H10K 59/1216; H10K 77/111; H10K 59/00;
(Continued)

(56) References Cited

U.S. PATENT DOCUMENTS 9,634,034 B2 * 4/2017 Moh .................. G02F 1/136286
9,835,917 B2 * 12/2017 Zhao .................. G01R 31/2825
(Continued)

FOREIGN PATENT DOCUMENTS

CN          102253507 A     11/2011
CN          109459895 A      3/2019
(Continued)

OTHER PUBLICATIONS

Translation of Chinese Office Action for corresponding Chinese Application No. 202010950350.X, dated Nov. 13, 2024, 17 pages.

*Primary Examiner* — Vu A Vu
(74) *Attorney, Agent, or Firm* — Westman, Champlin & Koehler, P.A.

(57) ABSTRACT

A display substrate, a method of manufacturing the display substrate, and a display device are provided. The display substrate includes: a base substrate, a plurality of sub-pixels, a gate driving circuit, a plurality of input contact pads, a plurality of output contact pads and a contact pad insulating layer. Surfaces of the input contact pads away from the base
(Continued)

substrate and surfaces of the output contact pads away from the base substrate are exposed from the contact pad insulating layer. The contact pad insulating layer includes a first portion having a first thickness and a second portion having a second thickness smaller than the first thickness. Edges of the input contact pads and edges of the output contact pads are covered by the first portion. The second portion is located in the region between the input contact pads and the output contact pads.

19 Claims, 19 Drawing Sheets

(51) Int. Cl.
*H10D 86/40* (2025.01)
*H10D 86/60* (2025.01)
*H10K 59/121* (2023.01)
*H10K 59/131* (2023.01)
*H10K 77/10* (2023.01)
*H10K 59/00* (2023.01)

(52) U.S. Cl.
CPC ..... *H10K 59/1213* (2023.02); *H10K 59/1216* (2023.02); *H10K 77/111* (2023.02); *H10K 59/00* (2023.02)

(58) Field of Classification Search
CPC .... H10K 59/1201; H10K 71/70; G09G 3/006; G09G 2300/0426; H01L 27/124; H01L 27/1255; H01L 23/544; G02F 1/13; G06F 3/041
USPC .......................................................... 257/40
See application file for complete search history.

(56) References Cited

U.S. PATENT DOCUMENTS

| | | | |
|---|---|---|---|
| 10,192,937 B2* | 1/2019 | Kim | H10K 59/131 |
| 10,446,635 B2* | 10/2019 | Moon | H10K 59/131 |
| 10,763,450 B2 | 9/2020 | Xin et al. | |
| 10,872,944 B2 | 12/2020 | Kim et al. | |
| 10,879,319 B2* | 12/2020 | Bang | G06F 3/04164 |
| 10,978,447 B2* | 4/2021 | Kim | H10K 50/824 |
| 10,985,194 B2 | 4/2021 | Luo | |
| 11,152,440 B2* | 10/2021 | Jeon | H01L 24/32 |
| 11,183,543 B2* | 11/2021 | Bang | H10K 59/40 |
| 11,392,215 B2 | 7/2022 | Morrison et al. | |
| 11,871,624 B2* | 1/2024 | Son | H10K 59/124 |
| 11,943,956 B2* | 3/2024 | Woo | G06F 3/0412 |
| 2017/0125451 A1 | 5/2017 | Kang et al. | |
| 2018/0063962 A1 | 3/2018 | Lee et al. | |
| 2019/0027551 A1 | 1/2019 | Jang et al. | |
| 2019/0393440 A1 | 12/2019 | Xin et al. | |
| 2020/0168684 A1 | 5/2020 | Kim et al. | |
| 2020/0194468 A1 | 6/2020 | Luo | |
| 2021/0074784 A1 | 3/2021 | Kim et al. | |
| 2021/0257435 A1* | 8/2021 | Kim | H10K 59/353 |
| 2021/0349546 A1 | 11/2021 | Morrison et al. | |
| 2021/0399262 A1* | 12/2021 | Woo | H10K 59/873 |
| 2021/0408214 A1* | 12/2021 | Wang | H10K 59/131 |

FOREIGN PATENT DOCUMENTS

| | | |
|---|---|---|
| CN | 109616480 A | 4/2019 |
| CN | 109860224 A | 6/2019 |
| CN | 109961727 A | 7/2019 |
| CN | 111223817 A | 6/2020 |
| CN | 111223899 A | 6/2020 |
| CN | 212625587 U | 2/2021 |
| KR | 20140069716 A | 6/2014 |
| WO | 2020074869 A1 | 4/2020 |

* cited by examiner

DISPLAY SUBSTRATE, METHOD OF MANUFACTURING THE DISPLAY SUBSTRATE, AND DISPLAY DEVICE

CROSS REFERENCE TO RELATED APPLICATION(S)

This application is a Section 371 National Stage Application of International Application No. PCT/CN2021/110548, filed on Aug. 4, 2021, entitled "DISPLAY SUBSTRATE, METHOD OF MANUFACTURING THE DISPLAY SUBSTRATE, AND DISPLAY DEVICE", which published as WIPO Publication No. WO 2022/052681 A1, on Mar. 17, 2022, not in English, which claims priority to Chinese Patent Application No. 202010950350.X, filed on Sep. 10, 2020, the disclosures of which are incorporated herein by reference in their entireties.

TECHNICAL FIELD

The present disclosure relates to a field of display technology, and in particular to a display substrate, a method of manufacturing the display substrate, and a display device.

BACKGROUND

Generally, in a display substrate, a pin used to be connected to a driver chip is designed in a multi-layer structure, so that the height of the pin is increased in order to enhance the bonding between the pin and a corresponding pin on the driver chip. During a fabrication process, the pin is covered by an organic layer, and then the organic layer on a surface of the pin is removed to expose the pin. However, when a traditional display substrate is subjected to a reliability test for high temperature and high humidity, a driver chip IC is easy to fall off.

SUMMARY

Embodiments of the present disclosure provides a display substrate, including:
  a base substrate including a display region, a bonding region located on at least one side of the display region, and a side region located on at least another side of the display region;
  a plurality of sub-pixels located in the display region;
  a gate driving circuit located in the side region, connected to the plurality of sub-pixels, and configured to provide a gate driving signal to the plurality of sub-pixels;
  a plurality of input contact pads located in the bonding region, and configured to be electrically connected to an external circuit;
  a plurality of output contact pads located in the bonding region between the plurality of input contact pads and the display region, and electrically connected to the plurality of sub-pixels and the gate driving circuit; and
  a contact pad insulating layer located in the bonding region within a gap between adjacent input contact pads among the plurality of input contact pads, a gap between adjacent output contact pads among the plurality of output contact pads, and a region between the plurality of input contact pads and the plurality of output contact pads, wherein surfaces of the plurality of input contact pads away from the base substrate and surfaces of the plurality of output contact pads away from the base substrate are exposed from the contact pad insulating layer, wherein the contact pad insulating layer includes a first portion having a first thickness and a second portion having a second thickness smaller than the first thickness, edges of the plurality of input contact pads and edges of the plurality of output contact pads are covered by the first portion of the contact pad insulating layer, and the second portion of the contact pad insulating layer is located in the region between the plurality of input contact pads and the plurality of output contact pads.

For example, the display substrate further includes: a plurality of first dummy contact pads located in the bonding region within the region between the plurality of input contact pads and the plurality of output contact pads,
  wherein edges of the plurality of first dummy contact pads are covered by the first portion of the contact pad insulating layer, and surfaces of the plurality of first dummy contact pads away from the base substrate are exposed from the first portion of the contact pad insulating layer; and
  wherein the second portion of the contact pad insulating layer includes a first sub-portion and a second sub-portion, the first sub-portion is located in a region between the plurality of first dummy contact pads and the plurality of input contact pads, the second sub-portion is located in a region between the plurality of first dummy contact pads and the plurality of output contact pads.

For example, the display substrate further includes: a plurality of array test contact pads located in the bonding region within the region between the plurality of first dummy contact pads and the plurality of input contact pads, and electrically connected to the plurality of sub-pixels,
  wherein the first portion of the contact pad insulating layer includes a first sub-portion and a second sub-portion, the edges of the plurality of input contact pads, the edges of the plurality of output contact pads and the edges of the first dummy contact pads are covered by the first sub-portion of the first portion of the contact pad insulating layer, edges of the plurality of array test contact pads are covered by the second sub-portion of the first portion of the contact pad insulating layer, and surfaces of the plurality of array test contact pads away from the base substrate are exposed from the first portion of the contact pad insulating layer; and
  wherein a projection of the second sub-portion of the first portion of the contact pad insulating layer on the base substrate is located within a projection of the first sub-portion of the second portion of the contact pad insulating layer on the base substrate.

For example, a projection of each of the plurality of input contact pads and the plurality of output contact pads on the base substrate is spaced from a projection of the second portion of the contact pad insulating layer on the base substrate by a distance of 3 μm to 100 μm.

For example, the second thickness is zero.

For example, the plurality of input contact pads are arranged in at least a first row along a first direction, which is an extension direction of a side edge of the display region facing the bonding region;
  the plurality of output contact pads are arranged in at least a second row along the first direction;
  the plurality of first dummy contact pads are arranged in at least a third row along the first direction; and
  the plurality of array test contact pads are arranged in at least a fourth row along the first direction.

For example, the display substrate further includes: a plurality of second dummy contact pads located in the bonding region and arranged in at least a first column and a second column along a second direction perpendicular to the first direction, wherein the first column and the second column are respectively located on two sides of the plurality of first dummy contact pads in the first direction, wherein edges of the plurality of second dummy contact pads are covered by the first portion of the contact pad insulating layer, and surfaces of the plurality of second dummy contact pads away from the base substrate are exposed from the first portion of the contact pad insulating layer; and wherein a projection of each of the plurality of second dummy contact pads on the base substrate is spaced from a projection of the second portion of the contact pad insulating layer on the base substrate by a distance of 3 μm to 100 μm.

For example, the at least one of the plurality of input contact pads and the plurality of output contact pads includes:

a first lead connection portion located on the base substrate, wherein a first lead connection portion of the input contact pad is electrically connected to a connection contact pad for connecting to the external circuit through a first lead disposed in the bonding region, a first lead connection portion of the output contact pad is electrically connected to the gate driving circuit or to at least one of the plurality of sub-pixels through a second lead disposed in the bonding region;

a first conductor portion located on a side of the first lead connection portion away from the base substrate, and electrically connected to the first lead connection portion;

a second conductor portion located on a side of the first conductor portion away from the base substrate, and electrically connected to the first conductor portion, wherein an edge of the second conductor portion is covered by the first portion of the contact pad insulating layer.

For example, the display substrate further includes:

a first gate insulating layer of the bonding region, wherein the first gate insulating layer of the bonding region is located in the bonding region and covers the base substrate, wherein the first lead connection portion is located on a side of the first gate insulating layer of the bonding region away from the base substrate;

a second gate insulating layer of the bonding region, wherein the second gate insulating layer of the bonding region is located in the bonding region on the side of the first gate insulating layer of the bonding region away from the base substrate, and covers the first lead connection portion;

an interlayer insulating layer of the bonding region, wherein the interlayer insulating layer of the bonding region is located in the bonding region on a side of the second gate insulating layer of the bonding region away from the base substrate, and the first conductor portion is electrically connected to the first lead connection portion through a via hole disposed in the second gate insulating layer of the bonding region and a via hole disposed in the interlayer insulating layer of the bonding region; and a passivation layer of the bonding region, wherein the passivation layer of the bonding region is located in the bonding region on a side of the interlayer insulating layer of the bonding region away from the base substrate and covers the first conductor portion, and the second conductor portion is electrically connected to the first conductor portion through a via hole disposed in the passivation layer of the bonding region.

For example, a thickness of a portion of the passivation layer of the bonding region located between the second portion of the contact pad insulating layer and the second gate insulating layer of the bonding region is greater than or equal to 0.

For example, the display substrate further includes:

a first gate insulating layer of the bonding region, wherein the first gate insulating layer of the bonding region is located in the bonding region and covers the base substrate, and the first lead connection portion is located on a side of the first gate insulating layer of the bonding region away from the base substrate;

a second gate insulating layer of the bonding region, wherein the second gate insulating layer of the bonding region is located in the bonding region on the side of the first gate insulating layer of the bonding region away from the base substrate, and covers the first lead connection portion;

an interlayer insulating layer of the bonding region, wherein the interlayer insulating layer of the bonding region is located in the bonding region on a side of the second gate insulating layer of the bonding region away from the base substrate, the first conductor portion is electrically connected to the first lead connection portion through a via hole disposed in the second gate insulating layer of the bonding region and a via hole disposed in the interlayer insulating layer of the bonding region, and the second conductor portion is located on the side of the first conductor portion away from the base substrate and covers the first conductor portion.

For example, the at least one of the plurality of input contact pads and the plurality of output contact pads further includes:

a third conductor portion located on a side of the second conductor portion away from the base substrate, and electrically connected to the second conductor portion.

For example, the display substrate further includes:

a barrier layer of the bonding region, wherein the barrier layer of the bonding region is located in the bonding region, and covers the second conductor layer and the first portion of the contact pad insulating layer, and an inorganic layer of the bonding region, wherein the inorganic layer of the bonding region is located in the bonding region and covers the barrier layer of the bonding region, and the third conductor portion is electrically connected to the second conductor portion through a via hole disposed in the barrier layer of the bonding region and a via hole disposed in the inorganic layer of the bonding region.

For example, at least one of the plurality of first dummy contact pads includes a fourth conductor portion, the fourth conductor portion is located on a side of the base substrate facing the plurality of input contact pads and the plurality of output contact pads, and an edge of the fourth conductor portion is covered by the first portion of the contact pad insulating layer, wherein at least one of the plurality of input contact pads and the plurality of output contact pads includes a first lead connection portion, a first conductor portion and a second conductor portion, and the fourth conductor portion is disposed in the same layer as the second conductor portion.

For example, the at least one of the plurality of first dummy contact pads further includes a fifth conductor portion, the fifth conductor portion is located between the fourth conductor portion and the base substrate and is electrically connected to the fourth conductor portion, and the fifth conductor portion is disposed in the same layer as the first conductor portion.

For example, at least one of the plurality of array test contact pads includes:
- a second lead connection portion located on a side of the base substrate facing the plurality of input contact pads and the plurality of output contact pads;
- a sixth conductor portion located on a side of the second lead connection portion away from the base substrate, and electrically connected to the second lead connection portion; and
- a seventh conductor portion located on a side of the sixth conductor portion away from the base substrate, and electrically connected to the sixth conductor portion, wherein an edge of the seventh conductor portion is covered by the first portion of the contact pad insulating layer,
- wherein at least one of the plurality of input contact pads and the plurality of output contact pads includes a first lead connection portion, a first conductor portion and a second conductor portion, the second lead connection portion is disposed in the same layer as the first lead connection portion, the sixth conductor portion is disposed in the same layer as the first conductor portion, and the seventh conductor portion is disposed in the same layer as the second conductor portion.

For example, at least one of the plurality of second dummy contact pads includes an eighth conductor portion, the eighth conductor portion is located on a side of the base substrate facing the plurality of input contact pads and the plurality of output contact pads, and an edge of the eighth conductor portion is covered by the first portion of the contact pad insulating layer,
- wherein at least one of the plurality of input contact pads and the plurality of output contact pads includes a first lead connection portion, a first conductor portion and a second conductor portion, and the eighth conductor portion is disposed in the same layer as the second conductor portion.

For example, the at least one of the plurality of second dummy contact pads further includes a ninth conductor portion, the ninth conductor portion is located between the eighth conductor portion and the base substrate and is electrically connected to the eighth conductor portion, and the ninth conductor portion is disposed in the same layer as the first conductor portion.

For example, at least one of the plurality of sub-pixels includes a pixel driving circuit, a first planarization layer, a first transfer electrode, a second planarization layer and a light-emitting element, wherein:
- the first planarization layer is located on a side of the pixel driving circuit away from the base substrate to provide a first planarization surface;
- the first transfer electrode is located on the first planarization surface, and is electrically connected to the pixel driving circuit through a via hole disposed in the first planarization layer;
- the second planarization layer is located on a side of the first transfer electrode away from the base substrate to provide a second planarization surface; and
- the light-emitting element is located on the second planarization surface, and is electrically connected to the first transfer electrode through a via hole disposed in the second planarization layer;
- wherein the contact pad insulating layer is disposed in the same layer as the second planarization layer.

For example, the pixel driving circuit includes a thin film transistor having a gate, a source and a drain, at least one of the plurality of input contact pads and the plurality of output contact pads includes a first lead connection portion, a first conductor portion and a second conductor portion, wherein:
- the first lead connection portion is disposed in the same layer as the gate;
- the first conductor portion is disposed in the same layer as the source and the drain; and
- the second conductor portion is disposed in the same layer as the first transfer electrode.

For example, the display substrate further includes a passivation layer of the display region, wherein the passivation layer of the display region is located between the pixel driving circuit and the first planarization layer, and the pixel driving circuit is further electrically connected to the first transfer electrode through a via hole disposed in the passivation layer of the display region; and
- a passivation layer of the bonding region, wherein the passivation layer of the bonding region is disposed in the same layer as the passivation layer of the display region.

For example, the display substrate further includes an encapsulation layer, a barrier layer of the display region, a first touch electrode layer, a second touch electrode layer and a touch insulating layer that are located in the display region, the encapsulation layer is located on a side of the light-emitting element away from the base substrate, the barrier layer of the display region is located on a side of the encapsulation layer away from the base substrate, the first touch electrode layer is located on a side of the barrier layer of the display region away from the base substrate, the touch insulating layer is located on a side of the first touch electrode layer away from the base substrate and covers the first touch electrode layer, and the second touch electrode layer is located on a side of the touch insulating layer away from the base substrate; and
- a barrier layer of the bonding region and an inorganic layer of the bonding region that are located in the bonding region, wherein at least one of the plurality of input contact pads and the plurality of output contact pads further includes a third conductor portion, the barrier layer of the bonding region is located in the same layer as the barrier layer of the display region, the inorganic layer of the bonding region is located in the same layer as the touch insulating layer, and the third conductor portion is located in the same layer as the second touch electrode layer.

For example, the at least one of the plurality of sub-pixels further includes an interlayer insulating layer of the display region, a first gate insulating layer of the display region and a second gate insulating layer of the display region, the interlayer insulating layer of the display region is located between the gate and the source and drain, the first gate insulating layer of the display region is located on a side of the interlayer insulating layer of the display region facing the base substrate, and the second gate insulating layer of the display region is located between the interlayer insulating layer of the display region and the first gate insulating layer of the display region;
- wherein the display substrate further includes an interlayer insulating layer of the bonding region, a first gate insulating layer of the bonding region, and a second gate insulating layer of the bonding region; and
- wherein the interlayer insulating layer of the bonding region is disposed in the same layer as the interlayer insulating layer of the display region, the first gate insulating layer of the bonding region is disposed in the same layer as the first gate insulating layer of the display region, and the second gate insulating layer of the bonding region is disposed in the same layer as the second gate insulating layer of the display region.

For example, the at least one of the plurality of sub-pixels further includes a storage capacitor, a first electrode of the storage capacitor is disposed in the same layer as the gate, and a second electrode of the storage capacitor is disposed between the interlayer insulating layer of the display region and the second gate insulating layer of the display region.

For example, the base substrate includes:
 a first flexible layer,
 a second flexible layer located on a side of the first flexible layer facing the plurality of input contact pads and the plurality of output contact pads;
 a first substrate barrier layer located between the first flexible layer and the second flexible layer;
 a second substrate barrier layer located on a side of the second flexible layer away from the first flexible layer; and
 a buffer layer located on a side of the second substrate barrier layer away from the first flexible layer.

The present disclosure further provides a display device, including the above-mentioned display substrate.

The present disclosure further provides a method of manufacturing the above-mentioned display substrate, including:
 providing a base substrate, wherein the base substrate includes a display region, a bonding region located on at least one side of the display region, and a side region located on at least another side of the display region;
 forming a plurality of sub-pixels in the display region;
 forming a gate driving circuit in the side region, wherein the gate driving circuit is connected to the plurality of sub-pixels, and is configured to provide a gate driving signal to the plurality of sub-pixels;
 forming, in the bonding region, a plurality of input contact pads configured to be electrically connected to an external circuit;
 forming a plurality of output contact pads in the bonding region, wherein the plurality of output contact pads are located between the plurality of input contact pads and the display region, and are electrically connected to the plurality of sub-pixels and the gate driving circuit;
 forming a contact pad insulating layer in the bonding region, wherein the contact pad insulating layer is located in a gap between adjacent input contact pads among the plurality of input contact pads, a gap between adjacent output contact pads among the plurality of output contact pads, and a region between the plurality of input contact pads and the plurality of output contact pads, wherein surfaces of the plurality of input contact pads away from the base substrate and surfaces of the plurality of output contact pads away from the base substrate are exposed from the contact pad insulating layer, wherein the contact pad insulating layer includes a first portion having a first thickness and a second portion having a second thickness smaller than the first thickness, edges of the plurality of input contact pads and edges of the plurality of output contact pads are covered by the first portion of the contact pad insulating layer, and the second portion of the contact pad insulating layer is located in the region between the plurality of input contact pads and the plurality of output contact pads.

DETAILED DESCRIPTION OF EMBODIMENTS

Although the drawings containing a preferred embodiment of the present disclosure will be referred to fully describe the present disclosure, before that, it should be understand that those skilled in the art may modify a described present disclosure in this article, and obtain a technical effect of the present disclosure. Therefore, it should be understand the above description is a wide range of disclosure for those skilled in the art, and its content is not to restrict an exemplary embodiment described in the present disclosure.

In addition, in the detailed description below, in order to facilitate explanation, many specific details are explained to provide a comprehensive understanding of the embodiments of the present disclosure. However, it is obvious that one or more embodiments may be implemented without these specific details. In other cases, well-known structures and devices are presented in a form of an icon to simplify the drawings.

Figure 1A:
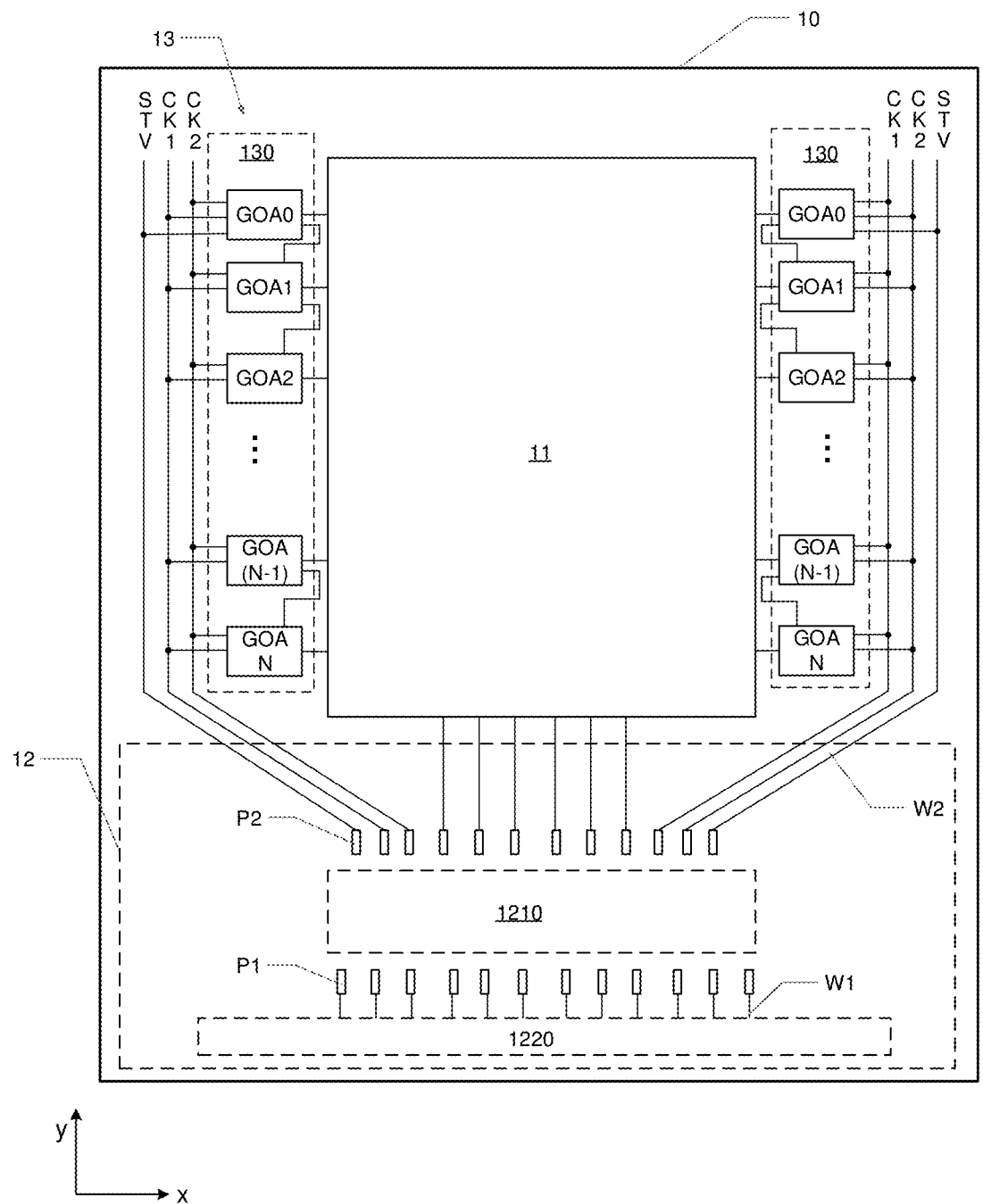
FIG. 1A shows a schematic diagram of a display substrate according to the embodiments of the present disclosure.
Figure 1B:
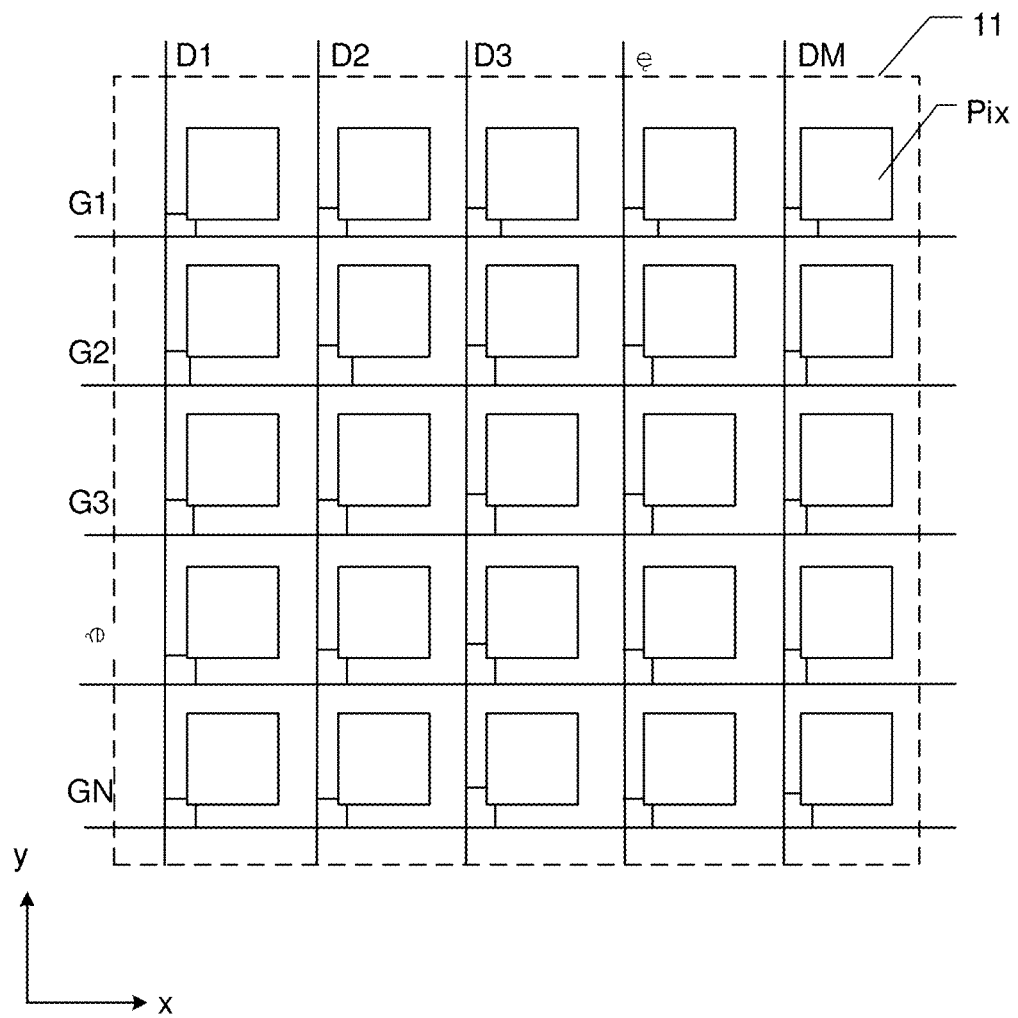
FIG. 1B shows a schematic diagram of a display region of the display substrate of FIG. 1A.

FIG. 1A shows a schematic diagram of a display substrate according to the embodiments of the present disclosure. FIG. 1B shows a schematic diagram of a display region of the display substrate of FIG. 1A.

As shown in FIG. 1A and FIG. 1B, the display substrate includes a base substrate 10. The base substrate 10 includes a display region 11, a bonding region 12 located on at least one side of the display region 11, and a side region 13 located on at least another side of the display region. In FIG. 1A, the bonding region 12 is located on one side of the display region 11 along a y direction, and the side region 13 is located on two sides of the display region 11 along a x direction. The display region 11 has a plurality of sub-pixels Pix. The plurality of sub-pixels Pix may be arranged in a form of an array. In FIG. 1B, the x indicates a row direction of the array of sub-pixels, and the y indicates a column direction of the array of sub-pixels. The display region 11 are further provided with a plurality of gate lines G1 to GN and a plurality of data lines D1 to DM. Each of the gate lines G1 to GN is connected to at least one row of sub-pixels Pix to provide a gate driving signal to the row of sub-pixels Pix. Each of the data lines D1 to DM is connected to at least one column of sub-pixels Pix to provide a data signal to the column of sub-pixels Pix. Each of sub-pixels Pix may be turned on under a control of the gate driving signal on the gate line connected to it. The turned on sub-pixels Pix may emit light under a driver of the data signal on the data line connected to it.

A gate driving circuit 130 is located in the side region 13. There are two gate driving circuits 130 in FIG. 1, which are respectively located in the side region 13 on two sides of the display region 11. The gate driving circuit 130 is connected to the plurality of sub-pixels Pix. In FIG. 1A and FIG. 1B, the gate driving circuit 130 is connected to a plurality rows of sub-pixels Pix through the plurality of gate lines G1 to GN to provide the gate driving signal to each row of sub-pixels Pix, respectively. As shown in FIG. 1A, the gate driving circuit 130 is further connected to various driving control signal lines, such as a first clock signal line CK1 for providing a first clock signal, a second clock signal line CK2 for providing a second clock signal and a startup signal line STV for providing a start signal. The gate driving circuit 130 may include multipolar cascaded shift registers GOA0 to GOAN, and each of the shift registers GOA0 to GOAN is connected to a corresponding driving control signal line to generate the gate driving signal under the control of the driving control signal and provide the gate driving signal to sub-pixels Pix of the display region 11.

A plurality of input contact pads P1 and a plurality of output contact pads P2 are located in the bonding region 12. The plurality of output contact pad P2 are located between the plurality of input contact pads P1 and the display region 11. In FIG. 1A, the plurality of input contact pads P1 are arranged in at least a first row along a first direction. The first direction is an extension direction of a side edge of the display region 11 facing the bonding region 12, which is the x direction. The plurality of output contact pads P2 are arranged in at least a second row along the first direction.

The plurality of input contact pads P1 are configured to connect to an external circuit. The plurality of output contact pads P2 are electrically connected to the sub-pixels Pix in the display region 11 and the gate driving circuit 130. For example, the plurality of input contact pads P1 may be respectively connected to a plurality of contact pads configured to connect a flexible circuit board in a region 1220 through a plurality of first leads W1. The plurality of output contact pads P2 may be respectively connected to the sub-pixels Pix in the display region 11 and the gate driving circuit 13 through a plurality of second leads W2. For example, the plurality of output contact pads P2 on a left side and a right side in FIG. 1A are respectively connected to the first clock signal line CK1, the second clock signal line CK2, and the startup signal line STV through the plurality of second leads W2, in order to connect to the gate driving circuit 13. The plurality of output contact pads P2 located in the middle of the FIG. 1A are respectively connected to the data lines D1 to DM in the display region 11 through the plurality of second leads W2, in order to connect to the sub-pixels Pix in the display region 11. In some embodiments, structures such as a cell test (CT) circuit, an electro-static discharge (ESD) circuit and a multiplexing circuit may be disposed in the bonding region 12. For example, the cell test circuit may be disposed in a region between the plurality of output contact pads P2 and the display region 11. The cell test circuit may be connected to a plurality of test signal lines and the plurality of sub-pixels in the display region. For example, the multiplexing circuit may be disposed in a region between the cell test circuit and the plurality of output contact pads P2. The multiplexing circuit may be connected to the data line of the display region and at least one of output contact pads P2, to provide a data signal provided by the output contact pads P2 to the data line of the display region after multiplexing. The embodiments of the present disclosure are not limited thereto. In some embodiments, at least one of the cell test circuit, the electro-static discharge circuit, the multiplexing circuit and other auxiliary circuits may be disposed in a region between the input contact pads P1 and the output contact pads P2. In other embodiments, the at least one of the cell test circuit, the electro-static discharge circuit, the multiplexing circuit and other auxiliary circuits may be located in a region between the output contact pads P2 and first dummy contact pads P3 described below.

When connecting a control chip to the display substrate, the input contact pad P1 is connected to an input pin of the control chip, and the output contact pads P2 are connected to an output pin of the control chip. A signal provided by the flexible circuit board (such as but not limited to a power signal, a control signal, etc.) is provided to the control chip through the input contact pad P1, so that the control chip generates a driving signal (such as but not limited to a clock signal, a startup signal, a data signal, etc.). The driving signal generated by the control chip is provided to the sub-pixels Pix in the display region 11 and/or the gate driving circuit through the output contact pads P2. For example, the data signal generated by the control chip is provided to the data lines D1 to DM through the output contact pads P2, in order to provide the data signal to the sub-pixels in the display region 11. The first clock signal, the second clock signal and the startup signal generated by the control chip are respectively provided to the first clock signal line CK1, the second clock signal line CK2 and the startup signal line STV through the output contact pads P2 located on two sides of the control chip, in order to provide the first clock signal, the second clock signal and the startup signal to the gate driving circuit 130.

In the bonding region 12, a contact pad insulating layer located in a region 1210 between the plurality of input contact pads P1 and the plurality of output contact pads P2 is as least partially removed, in order to alleviate a poor contact with the control chip due to the contact pad insulating layer in the region 1210. The following will refer to FIG. 2 to FIG. 15C to explain it in detail.

Figure 2:
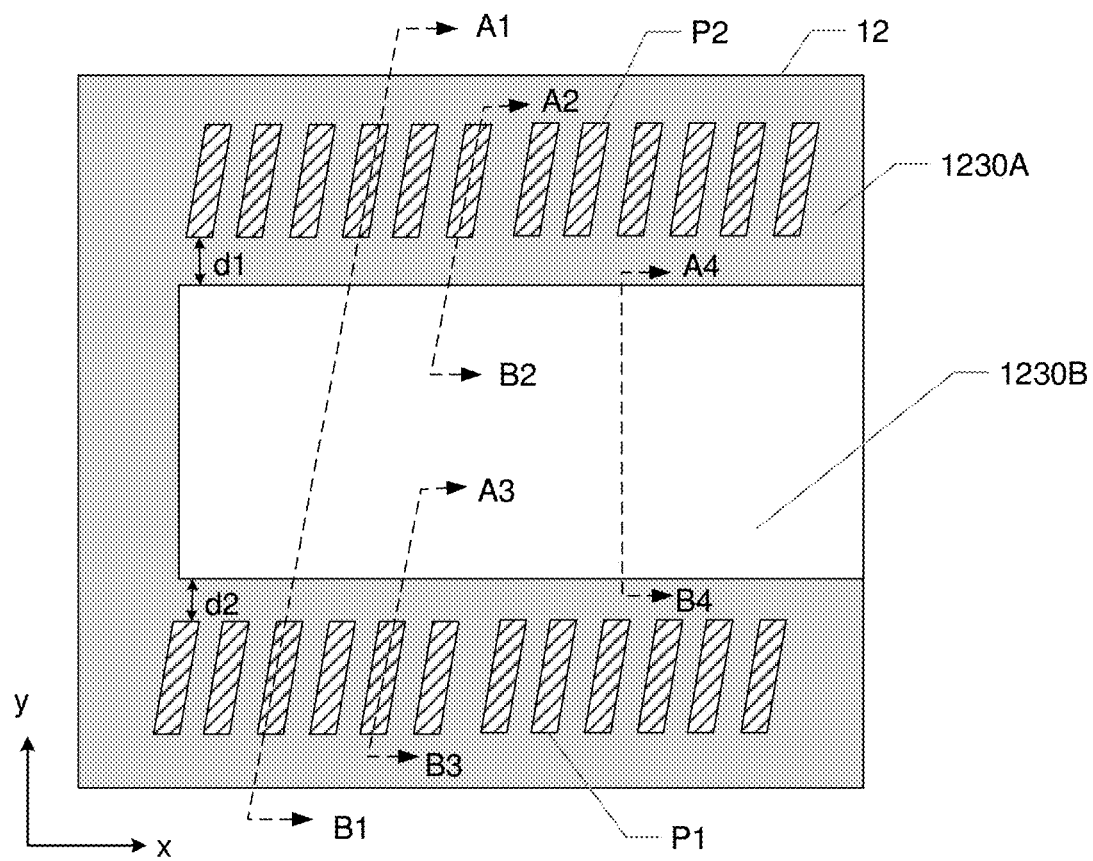
FIG. 2 shows a layout of a part of a bonding region of a display substrate according to the embodiments of the present disclosure.
Figure 3:
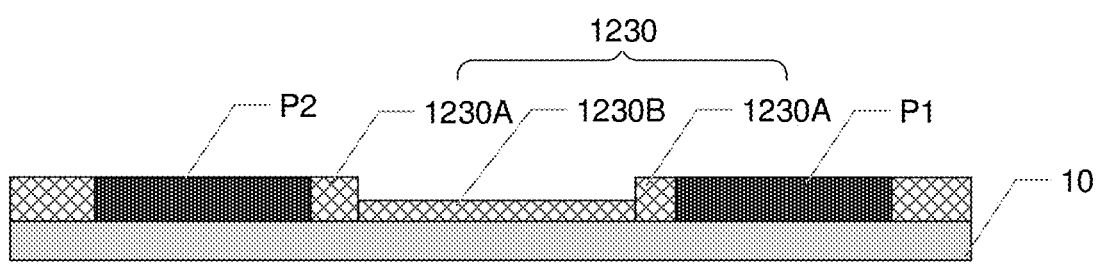
FIG. 3 shows a schematic diagram of a display substrate of FIG. 2 along a section of A1-B1.

FIG. 2 shows a layout of a part of a bonding region of the display substrate according to the embodiments of the present disclosure. FIG. 3 shows a schematic diagram of the display substrate of FIG. 2 along a section of A1-B1. It should be noted that, in order to facilitate the description, FIG. 2 only shows a part of the bonding region of FIG. 1A on one side (the left part of FIG. 1A, in FIG. 2), and the other side of the bonding region may have a similar structure, such as a symmetrical structure with respect to the left side. In addition, it should be noted that, a sectional view of FIG. 3 is just to explain a structural relationship of a first portion of the contact pad insulating layer and a second portion of the contact pad insulating layer as well as a difference in thickness. More details of a layer structure of the bonding region will be further explained in detail below.

As shown in FIG. 2 and FIG. 3, in the bonding region 12, a contact pad insulating layer 1230 is located in a gap between adjacent input contact pads P1 in the plurality of input contact pads P1, a gap between adjacent output contact pads P2 in the plurality of output contact pads P2, and the region between the plurality of input contact pads P1 and the plurality of output contact pads P2. Surfaces of the input contact pads P1 away from the base substrate 10 and surfaces of the output contact pads P2 away from the base substrate 10 are exposed from the contact pad insulating layer 1230. According to the embodiments of the present disclosure, the contact pad insulating layer 1230 includes a first portion 1230A having a first thickness and a second portion 1230B having a second thickness, and the second thickness is smaller than the first thickness. Edges of the input contact pads P1 and edges of the output contact pads P2 are covered by the first portion 1230A of the contact pad insulating layer 1230. The second portion 1230B of the contact pad insulating layer 1230 is located in the region between the plurality of input contact pads P1 and the plurality of output contact pads P1. As shown in FIG. 2, a projection of the input contact pad P1 on the base substrate 10 is spaced from a projection of the second portion 1230B of the contact pad insulating layer 1230 on the base substrate 10 by a distance d1. A projection of the output contact pads P2 on the base substrate 10 is spaced from a projection of the second portion 1230B of the contact pad insulating layer 1230 on the base substrate 10 by a distance d2. d1 and the d2 may be in a range of 3 μm to 100 μm. In some embodiments, d1 may be equal to d2.

Figure 4A:
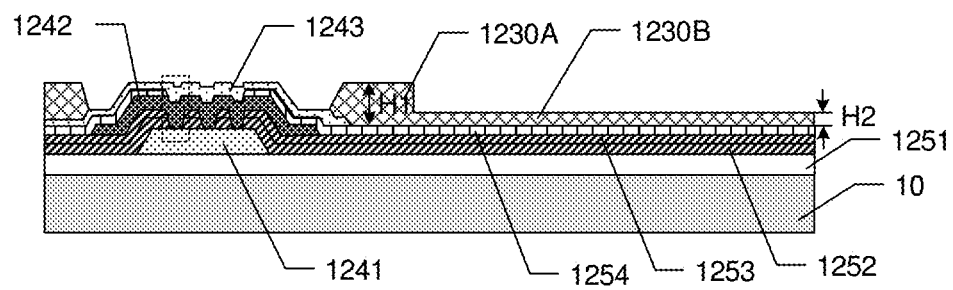
FIG. 4A shows a sectional view of an example of a display substrate of FIG. 2 along A2-B2.

FIG. 4A shows a sectional view of an example of the display substrate of FIG. 2 along A2-B2 in the bonding region.

As shown in FIG. 4A, the output contact pads P2 include a first lead connection portion 1241, a first conductor portion 1242 and a second conductor portion 1243. The first lead connection portion 1241 is located on the base substrate 10. Referring to FIG. 1A, the first lead connection portion 1241 of the output contact pad P2 may be connected to the second lead W2 of the bonding region, in order to be electrically connected to the gate driving circuit 130 or to at least one of the plurality of sub-pixels in the display region 11.

The first conductor portion 1242 is located on a side of the first lead connection portion 1241 away from the base substrate 10, and is electrically connected to the first lead connection portion 1241. The second conductor portion 1243 is located on a side of the first conductor portion 1242 away from the base substrate 10, and is electrically connected to the first conductor portion 1242.

The bonding region of the display substrate is further provided with a first gate insulating layer 1251 of the bonding region, a second gate insulating layer 1252 of the bonding region, an interlayer insulating layer 1253 of the bonding region, and a passivation layer 1254 of the bonding region. The first gate insulating layer 1251 of the bonding region covers the base substrate 10. The first lead connection portion 1241 is located on a side of the first gate insulating layer 1251 of the bonding region away from the base substrate 10. The second gate insulating layer 1252 of the bonding region is located on a side of the first gate insulating layer 1251 of the bonding region away from the base substrate 10 and covers the first lead connection portion 1241. The interlayer insulating layer 1253 of the bonding region is located on a side of the second gate insulating layer 1252 of the bonding region away from the base substrate 10. The passivation layer 1254 of the bonding region is located on a side of the interlayer insulating layer 1253 of the bonding region away from the base substrate 10 and covers the first conductor portion 1242.

As shown by the dotted frame in FIG. 4A, the first conductor portion 1242 is electrically connected to the first lead connection portion 1241 through a via hole disposed in the second gate insulating layer 1252 of the bonding region and a via hole disposed in the interlayer insulating layer 1253 of the bonding region. The second conductor portion 1243 is electrically connected to the first conductor portion 1242 through a via hole disposed in the passivation layer 1254 of the bonding region. In FIG. 4A, each of the second gate insulating layer 1252 of the bonding region, the interlayer insulating layer 1253 of the bonding region and the passivation layer 1254 of the bonding region is provided with a plurality of via holes, such as three. However, the embodiments of the present disclosure are not limited thereto. In other examples of the present disclosure, the number of via holes may further be set as required, such as two or four.

As shown in FIG. 4A, an edge of the second conductor portion 1243 of the output contact pad P2 is covered by the first portion 1230A of the contact pad insulating layer 1230 with a thickness H1. The second portion 1230B of the contact pad insulating layer 1230 with a thickness H2 is located in the region between the input contact pad P1 and the output contact pad P1, wherein the H2 is smaller than the H1. The so-called thickness may refer to a distance between a surface of the contact pad insulating layer 1230 on a side facing the base substrate 10 and a surface of the contact pad insulating layer 1230 on a side away from the base substrate 10. By making the thickness H2 smaller than the thickness H1, a surface of the second portion 1230B of the contact pad insulating layer 1230 on the side away from the base substrate 10 may be lower than a surface of the first portion 1230A of the contact pad insulating layer 1230 on the side away from the base substrate 10. As a result, the influence of the contact pad insulating layer 1230 on a connection reliability between the output contact pads P2 and the pin of the control chip may be alleviated, and at the same time, the first portion 1230A with a larger thickness may encapsulate the edges of the output contact pads P2, so as to protect the output contact pads P2.

Figure 4B:
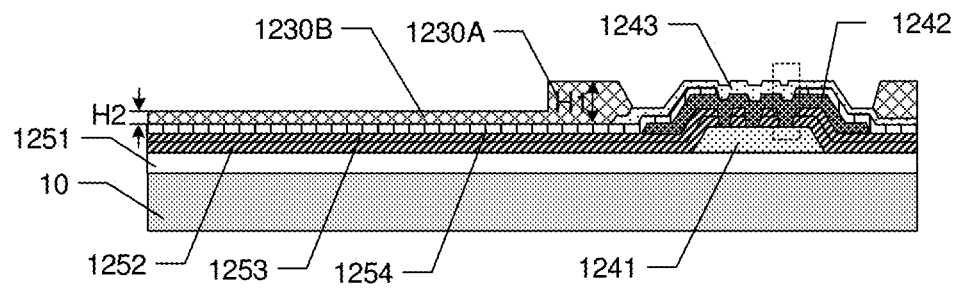
FIG. 4B shows a sectional view of an example of a display substrate of FIG. 2 along A3-B3.

FIG. 4B shows a sectional view of an example of the display substrate of FIG. 2 along A3-B3 in the bonding region.

As shown in FIG. 4B, a structure of the input contact pad P1 and a structure of the output contact pad P2 may be basically the same. The output contact pad P2 further includes the first lead connection portion 1241, the first conductor portion 1242 and the second conductor portion 1243. The first conductor portion 1242 is electrically connected to the first lead connection portion 1241 through the via hole disposed in the second gate insulating layer 1252 of the bonding region and the via hole disposed in the interlayer insulating layer 1253 of the bonding region. The second conductor portion 1243 is electrically connected to the first conductor portion 1242 through the via hole disposed in the passivation layer 1254 of the bonding region. Referring to FIG. 1A, the first lead connection portion 1241 of the input contact pad P1 may be connected to the first lead W1 of the bonding region 12, in order to be electrically connected to a connection contact pad for connecting to the external circuit in the region 1220.

In some embodiments, a material of the contact pad insulating layer 1230 may include inorganic insulating materials such as silicon oxide, silicon nitride, silicon oxynitride etc., or may include organic insulating materials such as polyimide, polyphthalimide, polyphthalamide, acrylic resin, benzocyclobutene or phenolic resin. The embodiments of the present disclosure do not specifically limit the material of the contact pad insulating layer. A material of the first conductor portion 1242 and a material of the second conductor portion 1243 may include a metal material or an alloy material, such as a metal single-layer structure or a metal multi-layer structure formed by molybdenum, aluminum, and titanium.

Figure 4C:
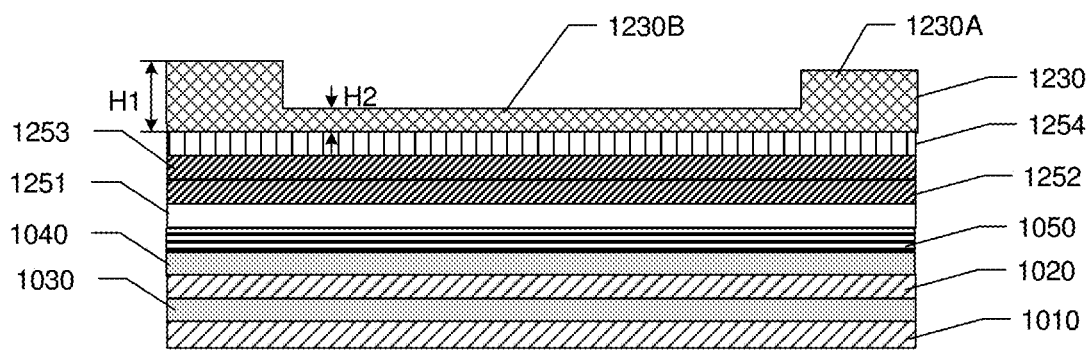
FIG. 4C shows a sectional view of an example of a display substrate of FIG. 2 along A4-B4.

FIG. 4C shows a sectional view of an example of the display substrate of FIG. 2 along A4-B4 in the bonding region.

The base substrate 10 of the embodiments of the present disclosure may include organic materials, such as one or more of resin materials including polyimide, polycarbonate, polyacrylate, polyetherimide, polyethersulfone, polyethylene terephthalate and polyethylene naphthalene ethylene dicarboxylate. The base substrate 10 may be a flexible substrate or a non-flexible substrate. In FIG. 4C, the base substrate 10 is the flexible substrate. The base substrate 10 may include a first flexible layer 1010, a second flexible layer 1020, a first substrate barrier layer 1030, a second substrate barrier layer 1040 and a buffer layer 1050. The second flexible layer 1020 is located on a side of the first flexible layer 1010 facing the plurality of input contact pads P1 and the plurality of output contact pads P2. The first substrate barrier layer 1030 is located between the first flexible layer 1020 and the second flexible layer 1020. The second substrate barrier layer 1040 is located on a side of the second flexible layer 1020 away from the first flexible layer 1010. The buffer layer 1050 is located on a side of the second substrate barrier layer 1040 away from the first flexible layer 1010. For example, a material of the buffer layer 1050 may include insulating materials such as silicon oxide, silicon nitride and silicon oxynitride. The buffer layer 1050 may prevent an interior of the display substrate from being invaded by a harmful substance in the base substrate 10, while enhance an adhesion of a film layer in the display substrate to the base substrate 10.

The first gate insulating layer 1251 of the bonding region, the second gate insulating layer 1252 of the bonding region, the interlayer insulating layer 1253 of the bonding region, the passivation layer 1254 of the bonding region and the contact pad insulating layer 1230 are sequentially stacked on a surface of the buffer layer 1050 away from the first flexible layer 1010. The contact pad insulating layer 1230 includes the first portion 1230A having the first thickness and the second portion 1230B having the second thickness, and the second thickness is smaller than the first thickness. Edge of the input contact pads P1 and edges of the output contact pads P2 are covered by the first portion 1230A of the contact pad insulating layer 1230. The second portion 1230B of the contact pad insulating layer 1230 is located in the region between the plurality of input contact pads P1 and the plurality of output contact pads P1.

Figure 5:
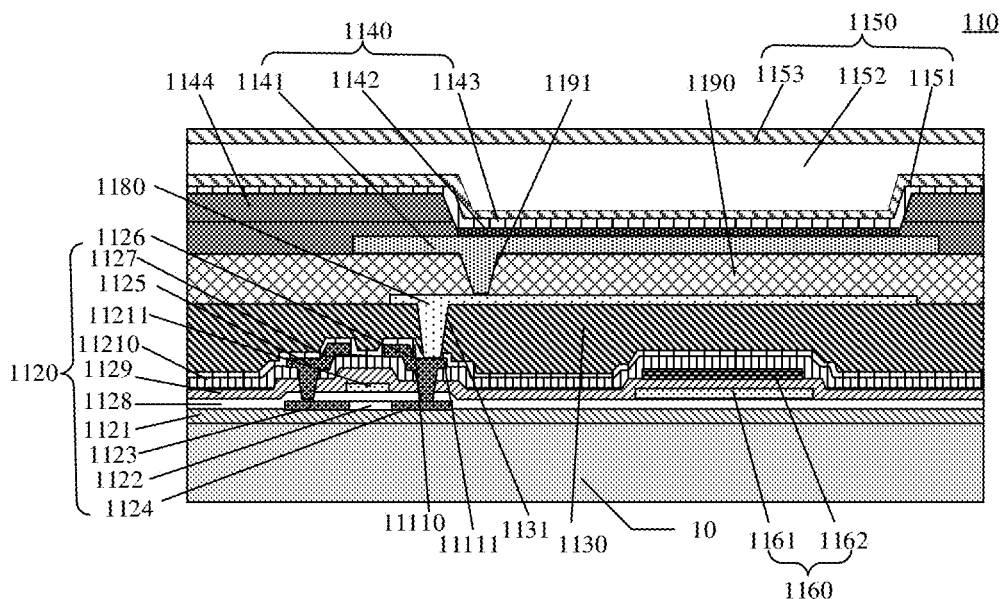
FIG. 5 shows a sectional view of a display region of a display substrate according to an embodiment of the present disclosure.

FIG. 5 shows a sectional view of the display region of the display substrate according to an embodiment of the present disclosure.

As shown in FIG. 5, the sub-pixels in the display region may include a pixel driving circuit 1120, a first planarization layer 1130, a first transfer electrode 1180, a second planarization layer 1190 and a light-emitting element 1140.

The pixel driving circuit 1120 includes an active layer 1122 located on the base substrate 10, a first gate insulating layer 1128 of the display region located on a side of the active layer 1122 away from the base substrate 1000, a gate 11211 located on the first gate insulating layer 1128 of the display region, a second gate insulating layer 1129 of the display region on a side of the gate 11211 away from the base substrate 10, an interlayer insulating layer 11210 of the display region on the second gate insulating layer 1129 of the display region, and a source 1125 and a drain 1126 located on the interlayer insulating layer 11210 of the display region. The gate 11211 may be disposed in the same layer as the first lead connection portion 1241 in the bonding region 12. The source 1125 and the drain 1126 may be disposed in the same layer as the first conductor portion 1242 in the bonding region 12. Therefore, the gate 11211 and the first lead connection portion 1241 may be formed in the same layer in a manufacturing process, for example, formed by using the same material layer through a patterning process. The source 1125 as well as the drain 1126 and the first conductor portion 1242 in the bonding region 12 may be formed in the same layer in the manufacturing process, for example, formed by using the same material layer through the patterning process. The first gate insulating layer 1128 of the display region is disposed in the same layer as the first gate insulating layer 1251 of the bonding region in the bonding region. The second gate insulating layer 1129 of the display region in the display region is disposed in the same layer as the second gate insulating layer 1252 in the bonding region. The interlayer insulating layer 11211 of the display region in the display region is disposed in the same layer as the interlayer insulating layer 1253 of the bonding region.

In some examples of the above-described embodiments of the present disclosure, the active layer 1122 may include a source region 1123, a drain region 1124 and a channel region between the source region 1123 and the drain region 1124. Each of the interlayer insulating layer 11210 of the display region, the second gate insulating layer 1129 of the display region and the first gate insulating layer 1128 of the display region has a via hole to expose the source region 1123 and the drain region 1124. The source 1125 and the drain 1126 are respectively electrically connected to the source region 1123 and the drain region 1124 through the via hole. The gate 11211 overlaps the channel region between the source region 1123 and the drain region 1124 in the active layer 1122 in a direction perpendicular to the base substrate 1000. The first planarization layer 1130 is located above the source 1125 and the drain 1126 for planarizing a surface of the pixel driving circuit 1120 on a side away from the base substrate. A via hole 1131 is formed in the first planarization layer 1130 to expose the source 1125 or the drain 1126 (the case shown in the figure). A passivation layer 11110 of the display region is formed between the pixel driving circuit 1120 and the first planarization layer 1130. The passivation layer 11110 of the display region includes a via hole 11111. The passivation layer 11110 of the display region may protect the source and the drain of the pixel driving circuit from being corroded by water vapor. The passivation layer 1254 of the bonding region in the display region may be disposed in the same layer as the passivation layer 11110 of the display region. Therefore, the passivation layer 1254 of the bonding region in the display region and the passivation layer 11110 of the display region may be formed in the same layer in the manufacturing process, for example, formed by using the same material layer through the patterning process.

A first transfer electrode 1180 is formed on the first planarization layer 1130. The first transfer electrode 1180 is electrically connected to the drain 1126 through the via hole 1131 and the via hole 11111. The first transfer electrode 1180 may avoid directly forming a straight via hole with an excessively large diameter in the first planarization layer 1130 and the second planarization layer 1190, so as to improve the quality of the electrical connection through via holes. Meanwhile, the first transfer electrode 1180 may further be formed in the same layer as other signal lines (such as a power line, etc.), so that process steps will not be increased. The first transfer electrode 1180 is disposed in the same layer as the second conductor portion 1243 of the contact pad 1210, so the first transfer electrode 1180 and the second conductor portion 1243 may be formed in the same layer in the manufacturing process, for example, formed by using the same material layer through the patterning process, thereby simplifying the manufacturing process.

For example, a material of the first transfer electrode 1180 may include the metal material or the alloy material, such as the metal single-layer structure or the metal multi-layer structure formed by molybdenum, aluminum, and titanium.

For example, a material of the active layer 1122 may include polysilicon or an oxide semiconductor (such as indium gallium zinc oxide). A material of the gate 11211 may include the metal material or the alloy material, such as the metal single-layer structure or the metal multi-layer structure formed by molybdenum, aluminum, and titanium. For example, the multi-layer structure is a multi-metal stack layer (such as a three-layer metal stack of titanium, aluminum and titanium, Ti/Al/Ti). A material of the source 1125 and the drain 1126 may include the metal material or the alloy material, such as the metal single-layer structure or the metal multi-layer structure formed by molybdenum, aluminum, and titanium. For example, the multi-layer structure is the multi-metal stack layer (such as the three-layer metal stack of titanium, aluminum and titanium, Ti/Al/Ti). The embodiments of the present disclosure do not specifically limit the material of each functional layer.

For example, a material of the passivation layer 11110 of the display region may include an organic insulating material or an inorganic insulating material, such as a silicon nitride material. Since silicon nitride has a high dielectric constant and good hydrophobic function, it may well protect the pixel driving circuit from being corroded by water vapor.

In some examples of the present disclosure, as shown in FIG. 5, the pixel driving circuit 1120 may further include a first metal layer 1127 of the display region, and the first metal layer 1127 of the display region is disposed in the same layer as the first conductor portion 1242. The first metal layer 1127 of the display region includes the above-mentioned source 1125 and the drain 1126 of a thin film transistor in the pixel driving circuit. The source 1125 and the drain 1126 are disposed in the same layer as the first conductor portion 1242.

In some examples of the present disclosure, as shown in FIG. 5, the second planarization layer 1190 is disposed on a side of the first transfer electrode 1180 away from the base substrate 10 to provide a polarization surface on the side of the first transfer electrode 1180 away from the base substrate 10. A via hole 1191 is formed in the second planarization layer 1190. The second planarization layer 1190 and the contact pad insulating layer 1230 in the bonding region 1200 are formed in the same layer, so the second planarization layer 1190 and the contact pad insulating layer 1230 may be formed in the same layer in the manufacturing process, for example, formed by using the same material layer through the patterning process, thereby simplifying the manufacturing process.

For example, the light-emitting element 1140 is formed on the second planarization layer, that is, the light-emitting element 1140 is disposed on a side of the second planarization layer 1190 away from the base substrate. The light-emitting element 1140 includes a first electrode 1141, a light-emitting layer 1142 and a second electrode 1143. The first electrode 1141 of the light-emitting element is electrically connected to the first transfer electrode 1180 through a second via hole 1191 in the second planarization layer 1140. A pixel defining layer 1144 is formed on the first electrode 1141. The pixel defining layer 1144 includes a plurality of openings to define a plurality of pixel units. Each of the plurality of openings exposes a corresponding first electrode 1141. After that, the light-emitting layer 1142 is disposed in the plurality of openings of the pixel-defining layer 1144. The second electrode 1143 is disposed on the pixel defining layer 1144 and the light-emitting layer 1142. For example, the second electrode 1143 may be disposed in a part of or an entire display region, so that an entire surface may be formed during the manufacturing process.

For example, a material of the second planarization layer 1190 may include inorganic insulating materials such as silicon oxide, silicon nitride, silicon oxynitride etc., or may include organic insulating materials such as polyimide, polyphthalimide, polyphthalamide, acrylic resin, benzocyclobutene or phenolic resin. The embodiments of the present disclosure do not limit it.

For example, the first electrode 1141 may include a reflective layer, and the second electrode 1143 may include a transparent layer or a semitransparent layer. Thus, the first electrode 1141 may reflect light emitted from the light-emitting layer 1142, and this part of the light is emitted into an external environment through the second electrode 1143, so that light extraction efficiency may be increased. When the second electrode 1143 includes the semitransparent layer, some light reflected by the first electrode 1141 is re-reflected by the second electrode 1143, so the first electrode 1141 and the second electrode 1143 form a resonance structure, which may improve the light extraction efficiency.

For example, a material of the first electrode 1141 may include at least one transparent conductive oxide material including indium tin oxide (ITO), indium zinc oxide (IZO) and zinc oxide (ZnO), etc. In addition, the first electrode 1141 may include a metal having high reflectivity as a reflective layer, such as silver (Ag).

For example, for an OLED, the light-emitting layer 1142 may include a small molecular organic material or a polymer molecular organic material, may be a fluorescent light-emitting material or a phosphorescent light-emitting material, and may emit red light, green light, blue light, or white light. The light-emitting layer may further include functional layers, such as an electron injection layer, an electron transport layer, a hole injection layer, and a hole transport layer as required. For an OLED, the light-emitting layer may include a quantum dot material, such as a silicon quantum dot, a germanium quantum dot, a cadmium sulfide quantum dot, a cadmium selenide quantum dot, a cadmium telluride quantum dot, a zinc selenide quantum dot, a lead sulfide quantum dot, a lead selenide quantum dot, a indium phosphide quantum dot and an indium arsenide quantum dot, etc., and a particle size of the quantum dot is 2 nm to 20 nm.

For example, the second electrode 1143 may include various conductive materials. For example, the second electrode 1143 may include the metal material such as lithium (Li), aluminum (Al), magnesium (Mg) and silver (Ag).

For example, a material of the pixel defining layer 1144 may include organic insulating materials such as polyimide, polyphthalimide, polyphthalamide, acrylic resin, benzocyclobutene or phenolic resin, or may include inorganic insulating materials such as silicon oxide, silicon nitride, etc. The embodiments of the present disclosure do not limit it.

In addition, the display substrate further includes a storage capacitor 1160, and the storage capacitor 1160 may include a first electrode 1161 and a second electrode 1162. The first electrode 1161 of the storage capacitor 1160 is disposed between the first gate insulating layer 1128 of the display region and the second gate insulating layer 1129 of the display region, and the second electrode 1162 of the storage capacitor 1160 is disposed between the second gate insulating layer 1129 of the display region and the interlayer insulating layer 11210 of the display region. The first electrode 1161 and the second electrode 1162 are overlapped, and at least partially overlap in the direction perpendicular to the base substrate 10. The first electrode 1161 and the second electrode 1162 use the second gate insulating layer 1129 of the display region as a dielectric material to form the storage capacitor. The first electrode 1161 is disposed in the same layer as the gate 11211 in the pixel driving circuit 1120 and a lead 1220 in the bonding region 1200. Likewise, as described above, in a variation of the above example, the first electrode of the storage capacitor 1160 and the second electrode of the storage capacitor 1160 may further be located in other layers, thereby resulting in sub-pixels of different structures.

In another example, as a variation of the example shown in FIG. 5, the first electrode of the storage capacitor is still disposed in the same layer as the gate 11211, while the second electrode of the storage capacitor is disposed in the same layer as the source 1125 and the drain 1126 in the thin film transistor (i.e. further located in the first metal layer 1127 of the display region), thus the first electrode of the storage capacitor and the second electrode of the storage capacitor use a stack of the second gate insulating layer 1129 of the display region and the interlayer insulating layer 11210 of the display region as the dielectric material to form the storage capacitor.

In another example, as the variation of the example shown in FIG. 5, the first electrode of the storage capacitor is located between the second gate insulating layer 1129 of the display region and the interlayer insulating layer 11210 of the display region instead of being disposed in the same layer as the gate 11211. The second electrode of the storage capacitor is disposed in the same layer as the source 1125 and the drain 1126 in the thin film transistor (i.e. further located in the first metal layer 1127 of the display region). Accordingly, the storage capacitor is formed by using interlayer insulating layer 11210 of the display region as the dielectric material of the first electrode of the storage capacitor and the second electrode of the storage capacitor.

In some examples of the present disclosure, as shown in FIG. 5, the display substrate may further include an encapsulation layer 1150 disposed on the light-emitting element 1140. The encapsulation layer 1150 seals the light-emitting element 1140 so that deterioration of the light-emitting element 1140 caused by moisture and/or oxygen included in the environment may be reduced or prevented. The encapsulation layer 1150 may be a single-layer structure or a composite layer structure, and the composite layer structure includes a stacked structure of an inorganic layer and an organic layer. For example, the encapsulation layer 1150 may include a first inorganic encapsulation layer 1151, a first organic encapsulation layer 1152 and a second inorganic encapsulation layer 1153 which are disposed in sequence. The encapsulation layer 1150 may extend to the bonding region, which does not cover the contact pad in the above example.

For example, a material of the encapsulation layer may include insulating materials such as silicon nitride, silicon oxide, silicon oxynitride, and polymer resin. The inorganic materials such as silicon nitride, silicon oxide and silicon oxynitride have a high compactness and may prevent the intrusion of water and oxygen. A material of the organic encapsulation layer may be a polymer material containing a desiccant or a polymer material that may block water vapor, etc. For example, the polymer resin may planarize a surface of the display substrate, and may relieve a stress of the first inorganic encapsulation layer and a stress of the second inorganic encapsulation layer, and may further include water-absorbing materials such as the desiccant to absorb substances intruding inside, such as water and oxygen.

Figure 6A:
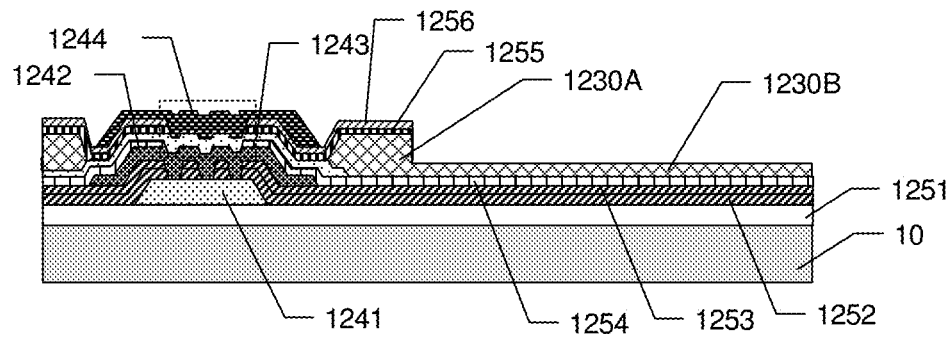
FIG. 6A and FIG. 6B show sectional views of another example of a display substrate of FIG. 2 along A2-B2 and A3-B3, respectively.
Figure 6B:
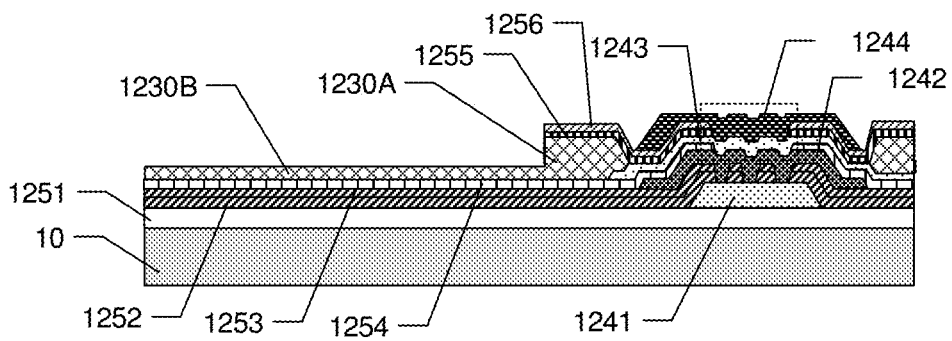

FIG. 6A and FIG. 6B show sectional views of another example of the display substrate of FIG. 2 along the A2-B2 and the A3-B3, respectively. Compared to the bonding region of FIG. 4A and FIG. 4B, the bonding region of FIG. 6A and FIG. 6B is at least different in that the input contact pad P1 and the output contact pad P2 further include a third conductor portion. For the sake of brevity, the difference will be mainly described in detail below.

As shown in FIG. 6A, the output contact pad P2 includes a third conductor portion 1244 in addition to the above-described first lead connection portion 1241, the first conductor portion 1242, and the second conductor portion 1243. The display substrate further includes a barrier layer 1255 of the bonding region and an inorganic layer 1256 of the bonding region. The third conductor portion 1244 is located on a side of the second conductor portion 1243 away from the base substrate 10, and the barrier layer 1255 of the bonding region and the inorganic layer 1256 of the bonding region are located between the third conductor portion 1244 and the second conductor portion 1243. The barrier layer 1255 of the bonding region covers the second conductor layer 1243 and the first portion 1230A of the contact pad insulating layer 1230, and the inorganic layer 1256 of the bonding region covers the barrier layer 1255 of the bonding region. The third conductor portion 1244 is electrically connected to the second conductor portion 1243 through a via hole disposed in the barrier layer 1255 of the bonding region and a via hole disposed in the inorganic layer 1256 of the bonding region (as shown by the dotted frame in FIG.

As shown in FIG. 6B, the input contact pads P1 have substantially the same structure as the output contact pads P2, and details are not repeated here.

Figure 7A:
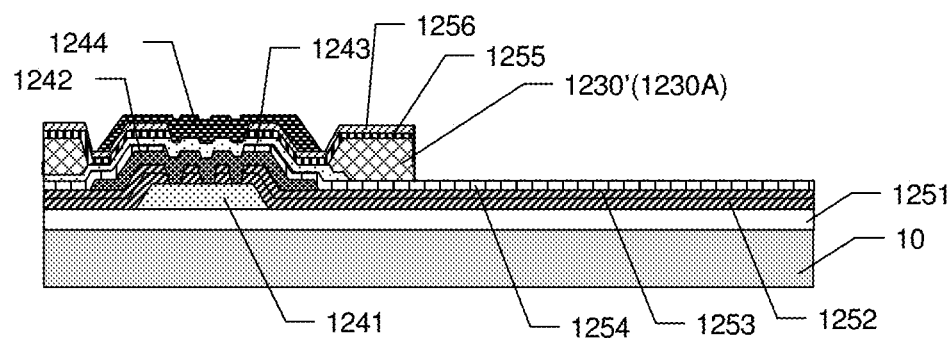
FIG. 7A and FIG. 7B show sectional views of another example of a display substrate of FIG. 2 in a bonding region along A2-B2 and A3-B3, respectively.
Figure 7B:
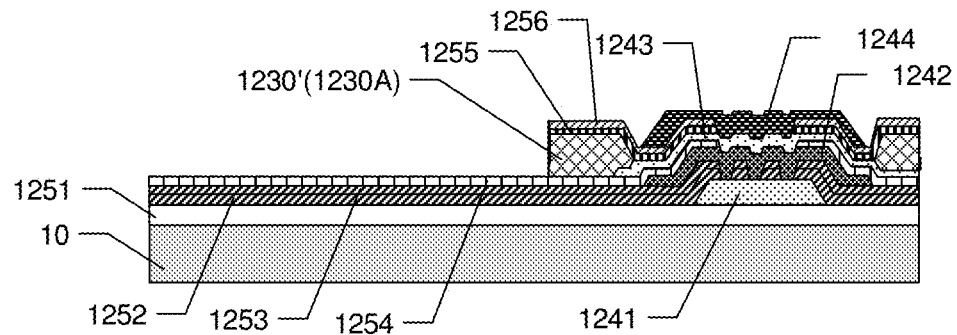

FIG. 7A and FIG. 7B show sectional views of another example of the display substrate of FIG. 2 in the bonding region along the A2-B2 and the A3-B3, respectively. Compared to the bonding region of FIG. 6A and FIG. 6B, the bonding region of FIG. 7A and FIG. 7B is at least different in that the second portion of the contact pad insulating layer is removed, that is, the second thickness is zero. As shown in FIG. 7A and FIG. 7B, the thickness of the second portion 1230B of the contact pad insulating layer 1230' is zero, that is, a second portion 1230B of a contact pad insulating layer 1230' is removed while a first portion 1230A of the contact pad insulating layer 1230' is retains. A thickness of a portion of the passivation layer 1254 of the bonding region located between the second portion 1230B and the second gate insulating layer 1254 of the bonding region is greater than zero, that is, at least partially retained.

Figure 8A:
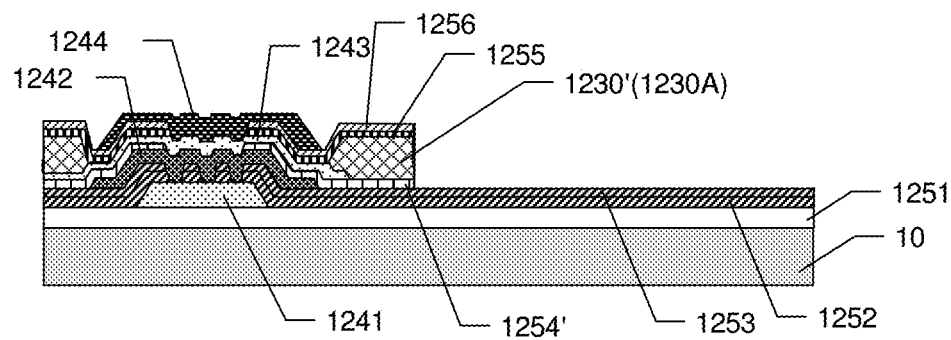
FIG. 8A and FIG. 8B show sectional views of another example of a display substrate of FIG. 2 in a bonding region along A2-B2 and A3-B3, respectively.
Figure 8B:
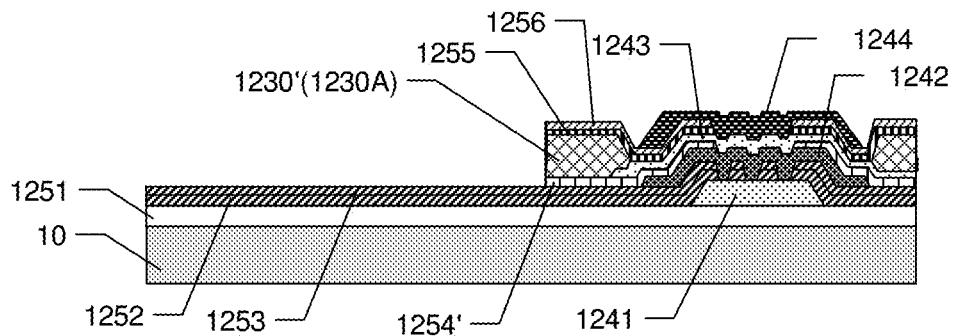

FIG. 8A and FIG. 8B show sectional views of another example of the display substrate of FIG. 2 in the bonding region along the A2-B2 and the A3-B3, respectively. Compared to the bonding region of FIG. 7A and FIG. 7B, the bonding region of FIG. 8A and FIG. 8B is at least different in that the passivation layer is partially removed. As shown in FIG. 8A and FIG. 8B, the second portion 1230B of the contact pad insulating layer 1230' and the passivation layer 1254 of the bonding region thereunder are removed, so that the thickness of the second portion 1230B is zero, and the thickness of the portion of the passivation layer 1254 of the bonding region located between the second portion 1230B of the contact pad insulating layer 1230' and the second gate insulating layer 1254 of the bonding region is further zero.

Figure 9:
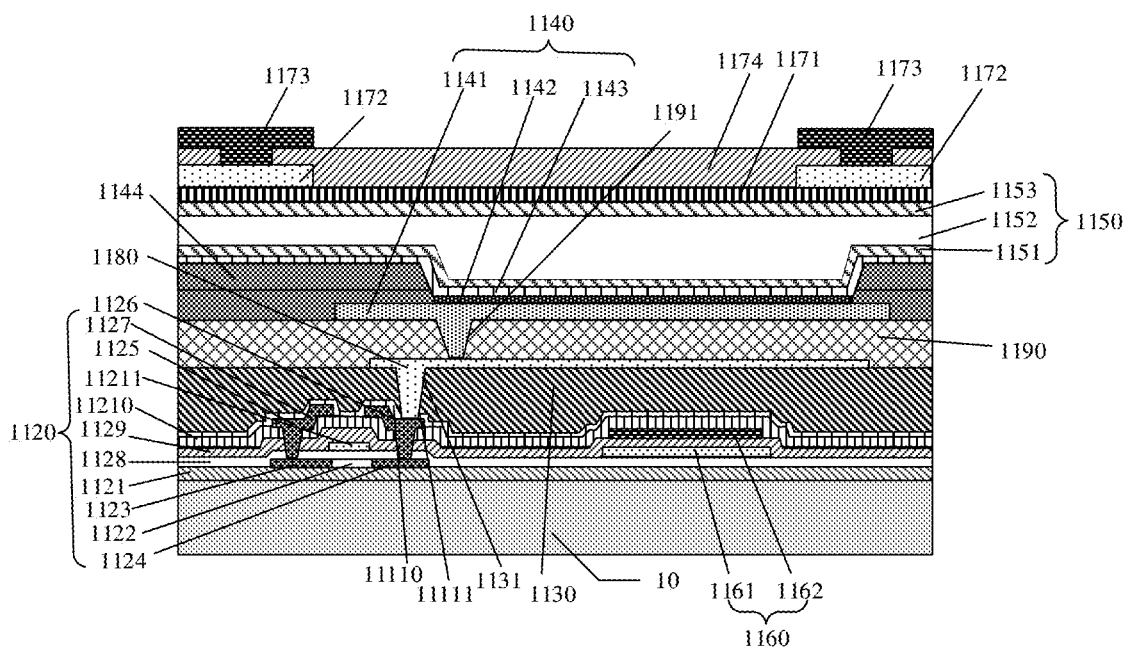
FIG. 9 shows a sectional view of a display region of a display substrate according to another embodiment of the present disclosure.

FIG. 9 shows a sectional view of the display region of the display substrate according to another embodiment of the present disclosure. Compared to the display region of FIG. 5, the display region of FIG. 9 is at least different in that the display substrate further includes a barrier layer of the display region, a first touch electrode layer, a second touch electrode layer and a touch insulating layer. For the sake of brevity, the difference will be mainly described in detail below.

As shown in FIG. 9, the encapsulation layer 1150 is located on a side of the light-emitting element 1140 away from the base substrate 10. A barrier layer 1171 of the display region is located on a side of the encapsulation layer 1150 away from the base substrate 10. A first touch electrode layer 1172 is located on a side of the encapsulation layer 1150 away from the base substrate 10. A touch insulating layer 1174 is located on a side of the first touch electrode layer 1172 away from the base substrate 10 and covers the first touch electrode layer 1172. A second touch electrode layer 1173 is located on a side of the touch insulating layer 1174 away from the base substrate 10. In FIG. 9, the second touch electrode layer 1173 is electrically connected to the first touch electrode layer 1172 through a via hole in the touch insulating layer 1174. The embodiments of the present disclosure are not limited thereto. The first touch electrode layer 1172 and the second touch electrode layer 1173 may be disposed in other patterns as required. The first touch electrode layer 1172 and the second touch electrode layer 1173 may be configured to obtain a capacitive touch structure, and the capacitive touch structure is a self-capacitance touch structure or a mutual capacitance touch structure.

The above-mentioned third conductor portion 1244 located in the bonding region may be disposed in the same layer as the second touch electrode layer 1173 in the display region. The above-mentioned barrier layer 1255 of the bonding region located in the bonding region may be disposed in the same layer as the barrier layer 1171 of the display region located in the display region. The above-mentioned inorganic layer 1256 of the bonding region located in the bonding region may be disposed in the same layer as the touch insulating layer 1174 of the display region.

Figure 10:
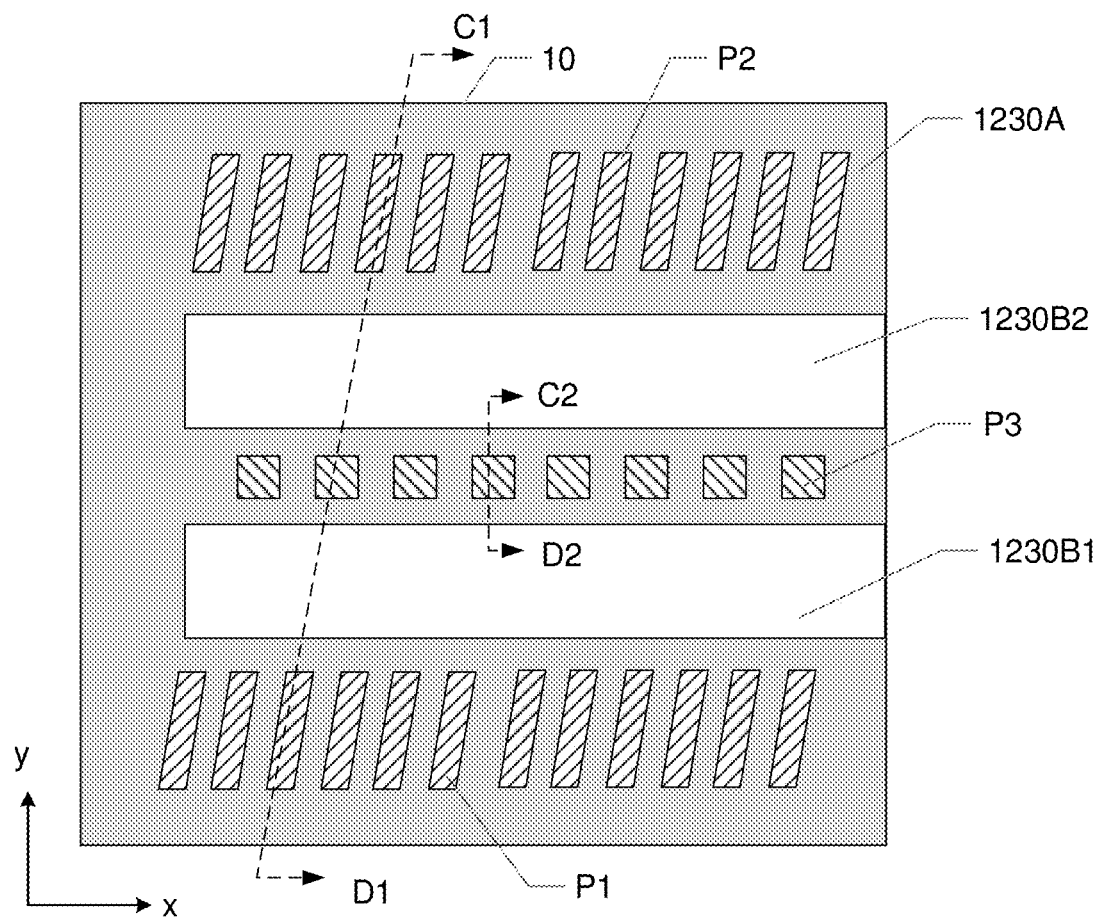
FIG. 10 shows a layout of a part of a bonding region of a display substrate according to another embodiment of the present disclosure.
Figure 11:
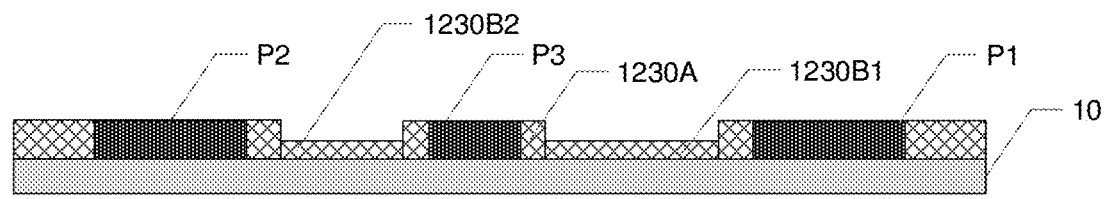
FIG. 11 shows a schematic diagram of a display substrate of FIG. 10 along a section of C1-D1.

FIG. 10 shows a layout of a part of the bonding region of the display substrate according to another embodiment of the present disclosure. FIG. 11 shows a schematic diagram of the display substrate of FIG. 10 along a section of C1-D1. Compared to the display substrate of FIG. 2 and FIG. 3, the display substrate of FIG. 10 and FIG. 11 is at least different in that a plurality of first dummy contact pads P3 is further disposed in the bonding region 12. For the sake of brevity, the difference will be mainly described in detail below.

As shown in FIG. 10 and FIG. 11, the display substrate further includes the plurality of first dummy contact pads P3. The plurality of first dummy contact pads P3 are located in the bonding region 12 in the region between the plurality of input contact pads P1 and the plurality of output contact pads P2. The first dummy contact pad P3 may not be connected to the lead. When the control chip is bonded to the bonding region of the display substrate, the first dummy contact pad P3 is docked with a corresponding pin on the control chip to play a supporting role. Edges of the first dummy contact pads P3 are covered by the first portion 1230A of the contact pad insulating layer 1230, and a surface of the first dummy contact pad P3 away from the base substrate 10 is exposed from the first portion 1230A of the contact pad insulating layer 1230. The second portion 1230B of the contact pad insulating layer 1230 includes a first sub-portion 1230B1 and a second sub-portion 1230B2. The first sub-portion 1230B1 is located in a region between the plurality of first dummy contact pads P3 and the plurality of input contact pads P1, and the second sub-portion 1230B2 is located in a region between the plurality of first dummy contact pads P3 and the plurality of output contact pads P2.

Figure 12A:
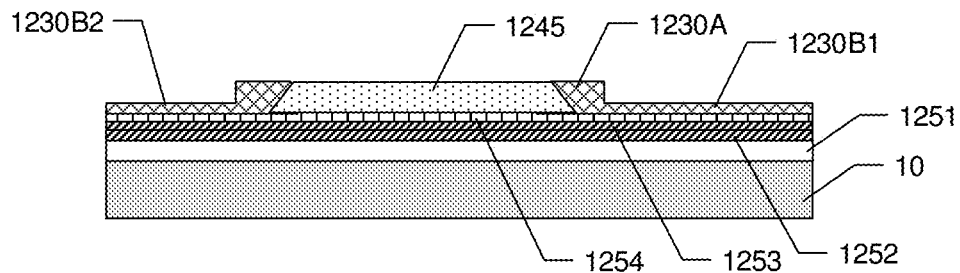
FIG. 12A shows a sectional view of an example of a display substrate of FIG. 11 along C2-D2.

FIG. 12A shows a sectional view of an example of the display substrate of FIG. 10 along C2-D2.

As shown in FIG. 12A, the first dummy contact pad P3 includes a fourth conductor portion 1245. The first gate insulating layer 1251 of the bonding region, the second gate insulating layer 1252 of the bonding region, the interlayer insulating layer 1253 of the bonding region and the passivation layer 1254 of the bonding region are sequentially stacked on the base substrate 10. The fourth conductor portion 1245 is located on a side of the passivation layer 1254 of the bonding region away from the base substrate 10, that is, located on a side of the base substrate 10 facing the plurality of input contact pads P1 and the plurality of output contact pads P2. The first portion 1230A of the contact pad insulating layer 1230 covers an edge of the fourth conductor portion 1245. The second portion 1230B of the contact pad insulating layer 1230 includes the first sub-portion 1230B1 and the second sub-portion 1230B2, and a thickness of the second portion 1230B is smaller than a thickness of the first portion 1230A. The fourth conductor portion 1245 may be disposed in the same layer as the above-mentioned second conductor portion 1243. For example, both the fourth conductor portion 1245 and the second conductor portion 1243 may be disposed in the same layer as the first transfer electrode 1180 of the display region.

Figure 12B:
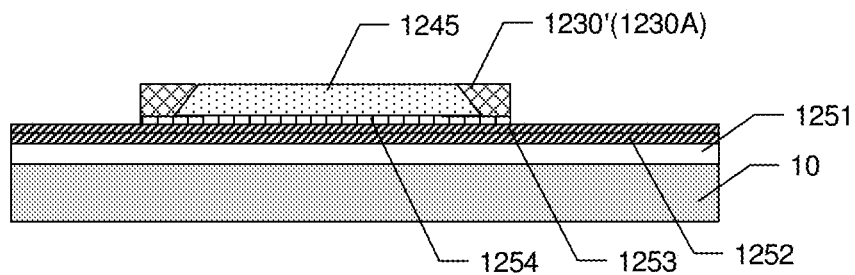
FIG. 12B shows a sectional view of another example of a display substrate of FIG. 11 along C2-D2.

FIG. 12B shows a sectional view of another example of the display substrate of FIG. 11 along the C2-D2. Compared to the display substrate of FIG. 12A, the display substrate of FIG. 12B is at least different in that the second portion of the contact pad insulating layer and a portion of the passivation layer of the bonding region are removed. As shown in FIG. 12B, the second portion 1230B of the contact pad insulating layer 1230' and a portion of the first gate insulating layer 1251 of the bonding region thereunder are removed, that is, both have a thickness of zero.

Figure 12C:
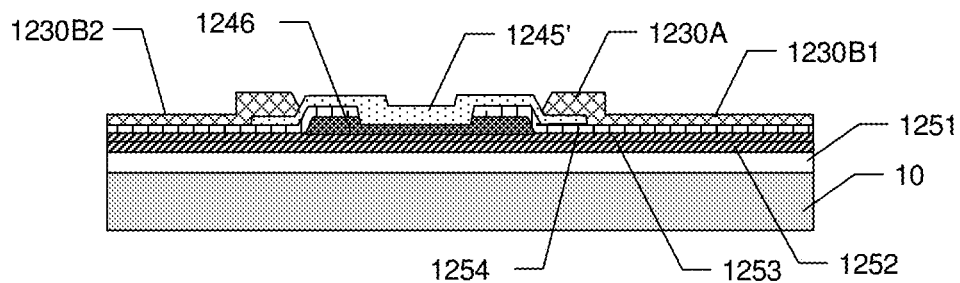
FIG. 12C shows a sectional view of another example of a display substrate of FIG. 11 along C2-D2.

FIG. 12C shows a sectional view of another example of the display substrate of FIG. 11 along the C2-D2. Compared to the display substrate of FIG. 12A, the display substrate of FIG. 12C is at least different in that the first dummy contact pad P3 includes a fifth conductor portion 1246 in addition to a fourth conductor portion 1245', and the fifth conductor portion 1246 is located between the fourth conductor portion 1245 and the base substrate 10.

In FIG. 12C, the first gate insulating layer 1251 of the bonding region, the second gate insulating layer 1252 of the bonding region and the interlayer insulating layer 1253 of the bonding region are sequentially stacked on the base substrate 10. The fifth conductor portion 1246 is located on a side of the interlayer insulating layer 1253 of the bonding region away from the base substrate 10. The passivation layer 1254 of the bonding region is located on a side of the interlayer insulating layer 1253 of the bonding region away from the base substrate 10 and covers an edge of the fifth conductor portion 1246. The fourth conductor portion 1245' is located on a side of the fifth conductor portion 1246 away from the substrate 10, and an edge of the fourth conductor portion is covered by the first portion of the contact pad insulating layer. The fifth conductor portion 1246 is electrically connected to the fourth conductor portion 1245 through a via hole in the passivation layer 1254 of the bonding region. The fourth conductor portion 1245' may be disposed in the same layer as the above-described second conductor portion 1243, and the fifth conductor portion 1246 may be disposed in the same layer as the above-described first conductor portion 1242. For example, the fourth conductor portion 1245' may be disposed in the same layer as the above-described second conductor portion 1243 and the first transfer electrode 1180 in the display region, and the fifth conductor portion 1246 may be disposed in the same layer as the above-described first conductor portion 1242 and the first metal layer 1127 of the display region.

Figure 13:
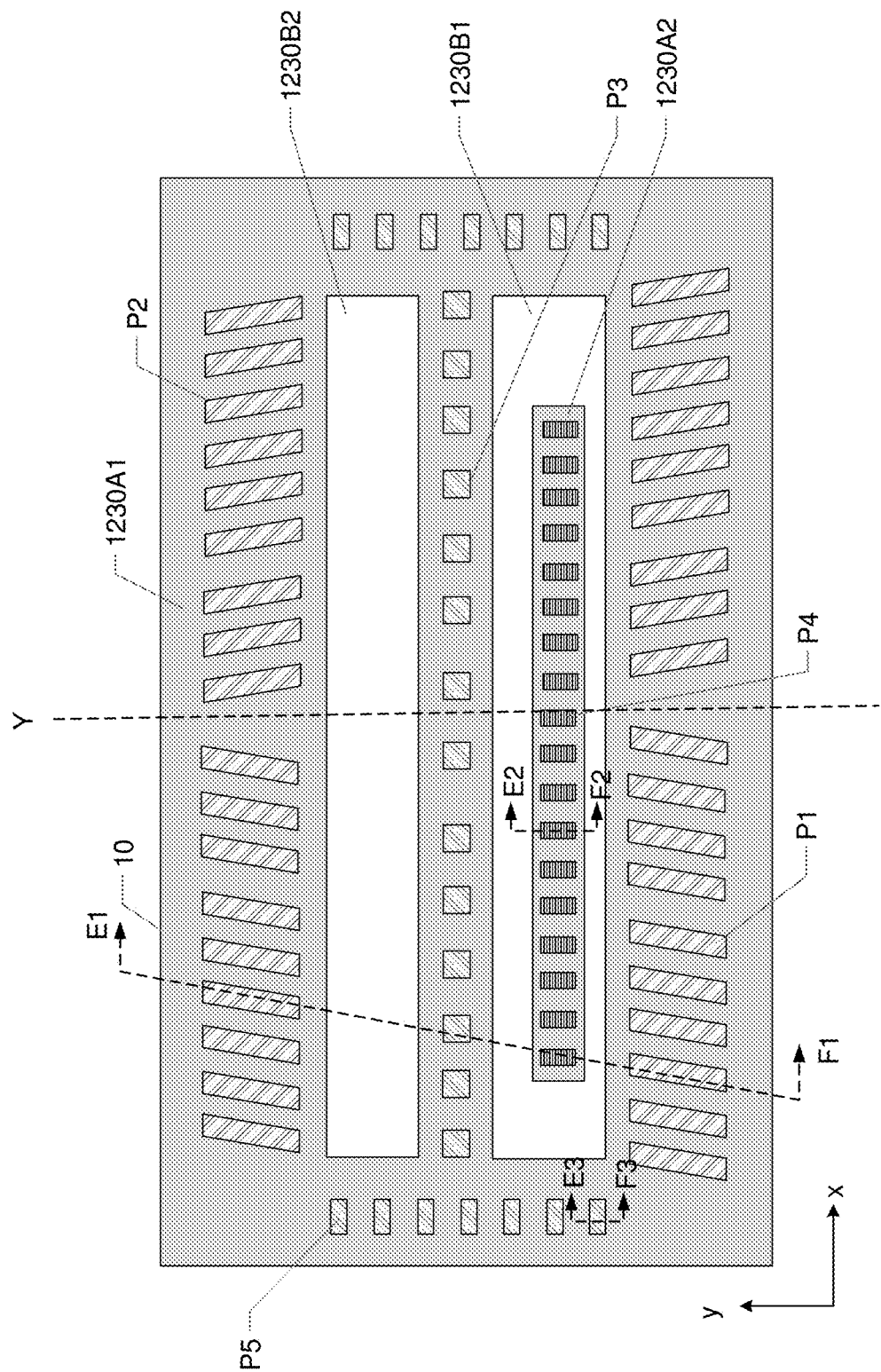
FIG. 13 shows a layout of a part of a bonding region of a display substrate according to another embodiment of the present disclosure.
Figure 14:
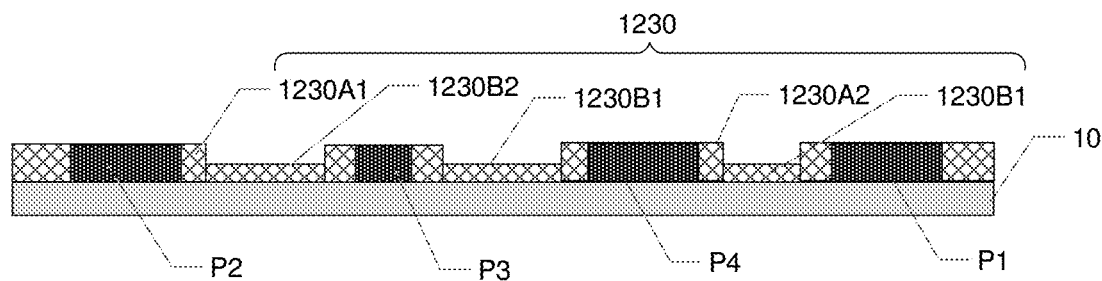
FIG. 14 shows a schematic diagram of a display substrate of FIG. 13 along a section of E1-F1.

FIG. 13 shows a layout of a part of the bonding region of the display substrate according to another embodiment of the present disclosure. FIG. 14 shows a schematic diagram of the display substrate of FIG. 13 along a section of E1-F1. Different from one-side schematic diagrams in FIG. 2 and FIG. 10, the layout of FIG. 13 shows a left side and a right side of the bonding region of the display substrate along the x direction. Compared to the display substrate of FIG. 10 and FIG. 11, the display substrate of FIG. 13 and FIG. 14 is at least different in that a plurality of array test contact pads P4 and a plurality of second dummy contact pads P5 are further disposed in the bonding region 12. For the sake of brevity, the difference will be mainly described in detail below.

As shown in FIG. 13 and FIG. 14, the plurality of array test contact pads P4 are further disposed in the bonding region of the display substrate, and the plurality of array test contact pads P4 are located in a region between the plurality of first dummy contact pads P1 and the plurality of input contact pads P2. The plurality of array test contact pads P4 are configured for an array test during the manufacturing process of the display substrate. The array test contact pad P4 may be connected to the plurality of sub-pixels. For example, at least one of the array test contact pads P4 may be connected to the sub-pixels of the display region through a lead of the bonding region. For example, at least one of the array test contact pads P4 is connected to the multiplexing circuit through the lead, so as to be connected to a plurality of data signal lines of the display region through the multiplexing circuit to obtain an electrical connection with the sub-pixels.

As shown in FIG. 13 and FIG. 14, the first portion 1230A of the contact pad insulating layer 1230 includes a first sub-portion 1230A1 and a second sub-portion 1230A2. Edges of the plurality of input contact pads P1, edges of the plurality of output contact pads P2, and edges of the first dummy contact pad P3 are covered by the first sub-portion 1230A1 of the first portion 1230A of the contact pad insulating layer 1230. Edges of the plurality of array test contact pads P4 are covered by the second sub-portion 1230A2 of the first portion 1230A of the contact pad insulating layer 1230. Surfaces of the plurality of array test contact pads P4 away from the base substrate 10 are exposed from the second sub-portion 1230A1 of the first portion 1230A of the pad insulating layer 1230. In some embodiments, as shown in FIG. 13, a projection of the second sub-portion 1230A2 of the first portion 1230A of the contact pad insulating layer 1230 on the base substrate 10 is within a projection of the first sub-portion 1230B1 of the second portion 1230B of the contact pad insulating layer 1230 on the base substrate 10. Such arrangement of the contact pad insulating layer 1230 makes it possible to protect the edges of the input contact pads P1, the edges of the output contact pads P2, the edges of the first dummy contact pads P3 and the edges of the array test contact pads P4, and to avoid etching the edges of the exposed contact pads by an etchant in the subsequent patterning process while improving a connection stability of the contact pads, thereby improving product yield and reliability of the display substrate.

In the above embodiments, the plurality of input contact pads P1 are arranged in the first row along the first direction. The first direction is the extension direction of the side edge of the display region facing the bonding region. The plurality of output contact pads P2 are arranged in the second row along the first direction. The plurality of first dummy contact pads are arranged in a third row along the first direction. The plurality of array test contact pads are arranged in a fourth row along the first direction. The embodiments of the present disclosure are not limited thereto, and any one of the input contact pad P1, the output contact pad P2, the first dummy contact pad P3 and the array test contact pad P4 may be arranged in multiple rows or in other forms as required.

In some embodiments, as shown in FIG. 13, the plurality of second dummy contact pads P5 may further be disposed in the bonding region of the display substrate. The second dummy contact pad P5 may have a structure similar to that of the first dummy contact pad P4, which may play the supporting role. The plurality of second dummy contact pads P5 are arranged in a first column and a second column along a second direction (y direction) perpendicular to the first direction, wherein the first column and the second column are respectively located in two sides of the plurality of first dummy contact pads P1 in the first direction. The embodiments of the present disclosure are not limited thereto, and the plurality of second dummy contact pads P5 may be arranged in multiple columns or in other forms as required, or may be located on one side (e.g. the left side or the left side) of the plurality of first dummy contact pads P1.

In FIG. 13, edges of the plurality of second dummy contact pads P5 are covered by the first portion 1230A of the contact pad insulating layer 1230. Surfaces of the plurality of second dummy contact pads P5 away from the base substrate 10 are disposed from the first portion 1230A of the contact pad insulating layer 1230. In some embodiments, as shown in FIG. 13, a certain spacing between each projection of the input contact pad P1, the output contact pad P2, the first dummy contact pad P3, the array test contact pad P4 and the second dummy contact pad P5 on the base substrate 10 and a projection of the second portion 1230B of the contact pad insulating layer 1230 on the base substrate 10 is exist, and the spacing may be in the range of 3 μm to 100 μm. A spacing between each of the input contact pad P1, the output contact pad P2, the first dummy contact pad P3, the array test contact pad P4, the second dummy contact pad P5 and the second portion 1230B of the contact pad insulating layer 1230 may be same or different. For example, the input contact pad P1, the output contact pad P2 and the second dummy contact pad P5 may be spaced from the second portion 1230B of the contact pad insulating layer 1230 by the same distance, which is greater than the distance by which each of the first dummy contact pad P3 and the array test contact pad P4 is spaced from the second portion 1230B of the contact pad insulating layer 1230.

In the above-described embodiments, the projections of each of the input contact pads P1, the output contact pads P2, the first dummy contact pads P3, the array test contact pads P4, and the second dummy contact pads P5 on the base substrate 10 are shown as having a specific shape. For example, the projection of the input contact pad P1 on the base substrate 10 and the projection of the output contact pad P2 on the base substrate 10 are a parallelogram. The projection of the array test contact pad P4 on the base substrate 10 and the projection of the second dummy contact pad P5 on the base substrate 10 are a rectangle. The projection of the first dummy contact pad P3 on the base substrate 10 is substantially a square. In FIG. 13, each of the input contact pad P1, the output contact pad P2, the first dummy contact pad P3, the array test contact pad P4, and the second dummy contact pad P5 is symmetrically disposed along a symmetry axis Y of the display substrate in the y direction. However, the embodiments of the present disclosure are not limited thereto, and the shape and arrangement of each contact pad may be disposed as required.

Figure 15A:
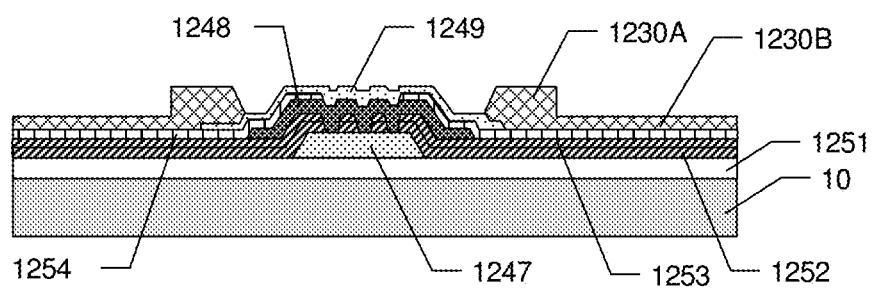
FIG. 15A shows a sectional view of an example of a display substrate of FIG. 13 along E2-F2.

FIG. 15A shows a sectional view of an example of the display substrate of FIG. 13 along E2-F2.

As shown in FIG. 15A, the array test contact pad P5 has a structure similar to the output contact pad of FIG. 4A and the input contact pad of FIG. 4B. The array test contact pad P5 includes a second lead connection portion 1247, a sixth conductor portion 1248 and a seventh conductor portion 1249. The second lead connection part 1247, the sixth conductor portion 1248 and the seventh conductor portion 1249 may be respectively disposed in the same layer as the first lead connection portion 1241, the first conductor portion 1242 and the second conductor portion 1243.

The second lead connection portion 1247 is located on the side of the base substrate 10 facing the plurality of input contact pads P1 and the plurality of output contact pads P2, configured to connect to the lead. The lead is connected to the data line, thereby obtaining an electrical connection between the second lead connection portion 1247 and the sub-pixels in the display region. The sixth conductor portion 1248 is located on a side of the second lead connection portion 1247 away from the base substrate 10, and is electrically connected to the second lead connection portion 1247. The seventh conductor portion 1249 is located on a side of the sixth conductor portion 1247 away from the base substrate 10, and is electrically connected to the sixth conductor portion 1248.

The second dummy contact pad P5 may have a structure similar to that of the above-described first dummy contact pad P4, which will be described below with reference to FIG. 15B to FIG. 15D.

Figure 15B:
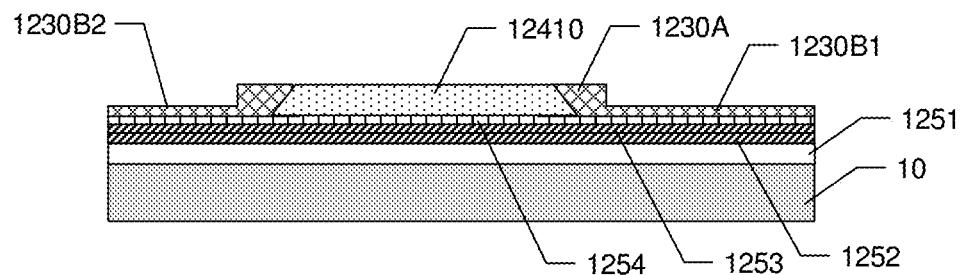
FIG. 15B shows a sectional view of an example of a display substrate of FIG. 13 along E3-F3.

FIG. 15B shows a sectional view of an example of the display substrate of FIG. 13 along E3-F3. As shown in FIG. 15B, the second dummy contact pad P5 has a structure similar to that of the first dummy contact pad P4 in FIG. 12A. The second dummy contact pad P5 includes an eighth conductor portion 12410, and the eighth conductor portion 12410 is located on the side of the substrate 10 facing the plurality of input contact pads P1 and the plurality of output contact pads P2. The eighth conductor portion 12410 may be disposed in the same layer as the above-described second conductor portion 1243. An edge of the eighth conductor portion 12410' is covered by the first portion 1230A of the contact pad insulating layer 1230, and in FIG. 15D, the edge of the eighth conductor portion 12410' is covered by the first sub-portion 1230A1 of the first portion 1230A of the contact pad insulating layer 1230.

Figure 15C:
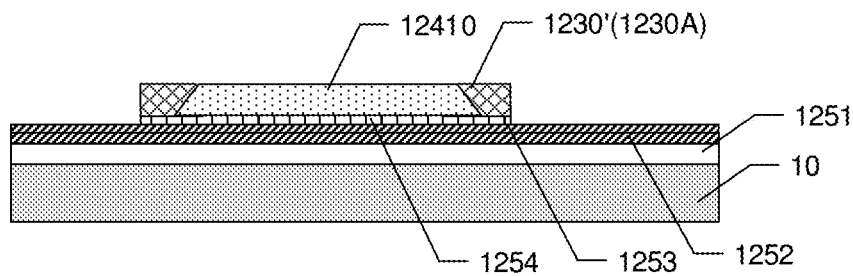
FIG. 15C shows a sectional view of another example of a display substrate of FIG. 13 along E3-F3.

FIG. 15C shows a sectional view of another example of the display substrate of FIG. 13 along the E3-F3. Compared to the display substrate of FIG. 15B, the display substrate of FIG. 15C is at least different in that the second portion 1230B of the contact pad insulating layer 1230 and the portion of passivation layer 1241 of the bonding region are removed. As shown in FIG. 15C, a thickness of the second portion 1230B of the contact pad insulating layer 1230' and a thickness of the first gate insulating layer 1251 of the bonding region are zero.

Figure 15D:
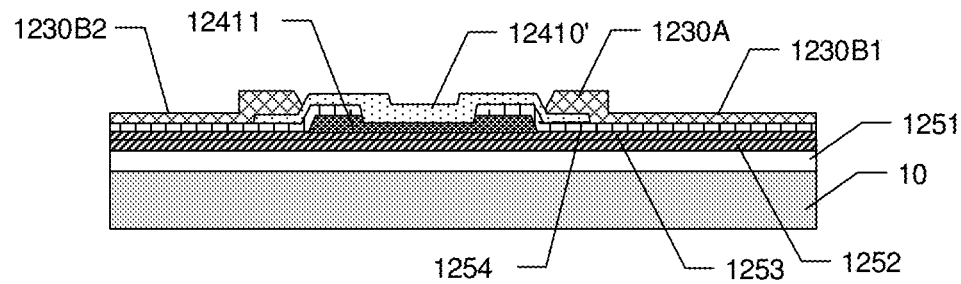
FIG. 15D shows a sectional view of another example of a display substrate of FIG. 13 along E3-F3.

FIG. 15D shows a sectional view of another example of the display substrate of FIG. 13 along the E3-F3. As shown in FIG. 15D, the second dummy contact pad P5 has a structure similar to that of the first dummy contact pad P4 of FIG. 12C, The second dummy contact pad P5 includes a ninth conductor portion 12411 in addition to a eighth conductor portion 12410'. The ninth conductor portion 12411 is located between the eighth conductor portion 12410' and the base substrate 10, and is electrically connected to the eighth conductor portion 12410'. The eighth conductor portion 12410' may be disposed in the same layer as the above-described second conductor portion 1243, and the ninth conductor portion may be disposed in the same layer as the above-described first conductor portion 1242. An edge of the eighth conductor portion 12410' is covered by the first portion 1230A of the contact pad insulating layer 1230, and in FIG. 15D, the edge of the eighth conductor portion 12410' is covered by the first sub-portion 1230A1 of the first portion 1230A of the contact pad insulating layer 1230.

Although the above describes an embodiment in which the second portion of the contact pad insulating layer and the passivation layer of the bonding region thereunder are thinned or removed with reference to a specific contact pad structure, the embodiments of the present disclosure are not limited thereto. The thinning or removal of the second portion of the contact pad insulating layer and the passivation layer of the bonding region thereunder is applicable to other contact pad structures, such as in some embodiments, at least one of second portions of the contact pad insulating layer and/or passivation layers of the bonding region thereunder in FIG. 4A to FIG. 4C, FIG. 12C and FIG. 15A to FIG. 15D may be thinned or removed as required.

Figure 16A:
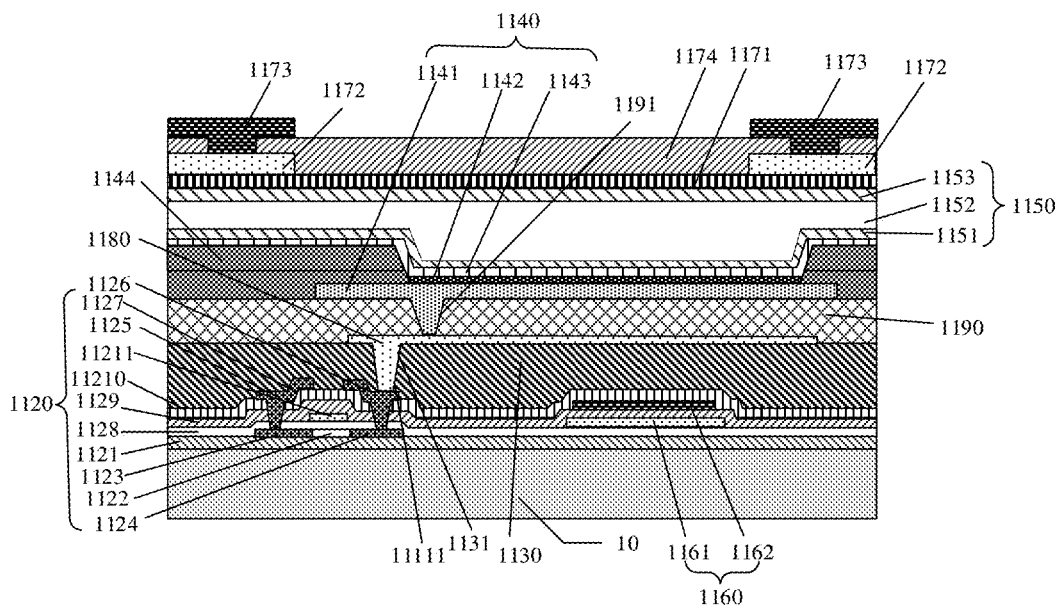
FIG. 16A shows a sectional view of a display region of a display substrate according to another embodiment of the present disclosure.
Figure 16B:
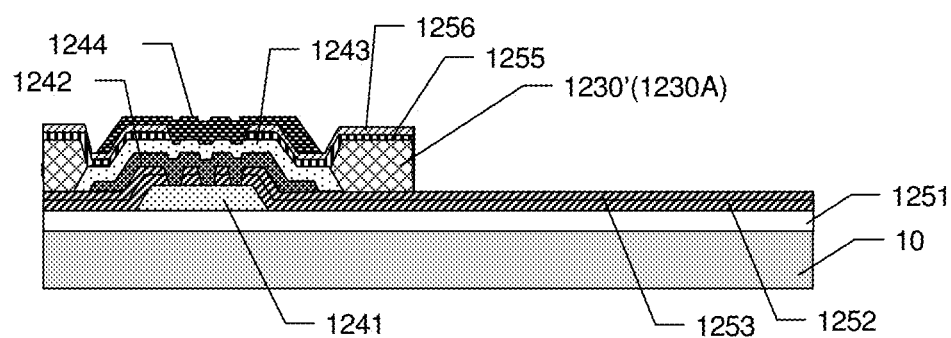
FIG. 16B shows a sectional view of a bonding region of a display substrate of FIG. 16A.

FIG. 16A shows a sectional view of the display region of the display substrate according to another embodiment of the present disclosure. FIG. 16B shows a sectional view of the bonding region of the display substrate of FIG. 16A. Compared to the display substrate of the above-described embodiments, the display substrate of FIG. 16A and FIG. 16B is at least different in that it does not have a passivation layer.

As shown in FIG. 16A, the display region of the display substrate has a structure similar to that of the display region of FIG. 9, except that the passivation layer 11110 of the display region is not provided. As shown in FIG. 16B, the bonding region of the display substrate has a structure similar to that of the bonding region in FIGS. 7A and 8A, except that the passivation layers 1245 and 1245' of the bonding region are not provided, the second conductor portion 1243 is located on the side of the first conductor portion 1242 away from the base substrate 10 and covers the first conductor portion 1242, and the contact pad insulating layer 1230' is disposed on the side of the interlayer insulating layer 1253 of the bonding region away from the base substrate 10 and covers the edge of the second conductor portion 1243.

For the sake of brevity, FIG. 16B only shows the output contact pad P2 and a structure of its surrounding bonding region, and other portions of the bonding region may be similar structure as those described in FIG. 4A to FIG. 4C, FIG. 6A to FIG. 8B, FIG. 12A to FIG. 12C and FIG. 15A to FIG. 15D, except that the passivation layer of the bonding region is removed from these structures.

At least one embodiment of the present disclosure provides a display device, and the display device may include the display substrate of any of the above-mentioned embodiments.

For example, in some examples, the display device may further include the flexible circuit board and the control chip. For example, the flexible circuit board is bonded to the bonding region of the display substrate, and the control chip is mounted on the flexible circuit board, thereby being electrically connected to the display region; or, the control chip is directly bonded to the bonding region, thereby being electrically connected to the display region.

For example, the control chip may be a central processing unit, a digital signal processor, a system-on-chip (SoC), etc. For example, the control chip may further include a memory, a power module, etc., and implement power supply and signal input and output functions through an additionally disposed wire and signal wire, etc. For example, the control chip may further include a hardware circuit, a computer executable code, etc. The hardware circuit may include a conventional very large scale integration (VLSI) circuit or a gate array as well as an off-the-shelf semiconductor such as a logic chip and a transistor, or other discrete components. The hardware circuit may further include a field programmable gate array, programmable array logic, a programmable logic device, etc.

For example, the display device provided by at least one embodiment of the present disclosure may be any product or component with a display function, such as a mobile phone, a tablet computer, a TV, a monitor, a notebook computer, a digital photo frame, and a navigator.

At least one embodiment of the present disclosure further provides a method of manufacturing the display substrate, the method includes: providing a base substrate, wherein the base substrate includes a display region, a bonding region located on at least one side of the display region, and a side region located on at least another side of the display region; forming a plurality of sub-pixels in the display region; forming a gate driving circuit in the side region, wherein the gate driving circuit is connected to the plurality of sub-pixels, and is configured to provide a gate driving signal to the plurality of sub-pixels; forming, in the bonding region, a plurality of input contact pads configured to be electrically connected to an external circuit; forming a plurality of output contact pads in the bonding region, wherein the plurality of output contact pads are located between the plurality of input contact pads and the display region, and are electrically connected to the plurality of sub-pixels and the gate driving circuit; forming a contact pad insulating layer in the bonding region, wherein the contact pad insulating layer is located in a gap between adjacent input contact pads among the plurality of input contact pads, a gap between adjacent output contact pads among the plurality of output contact pads, and a region between the plurality of input contact pads and the plurality of output contact pads, wherein surfaces of the plurality of input contact pads away from the base substrate and surfaces of the plurality of output contact pads away from the base substrate are exposed from the contact pad insulating layer, wherein the contact pad insulating layer includes a first portion having a first thickness and a second portion having a second thickness smaller than the first thickness, edges of the plurality of input contact pads and edges of the plurality of output contact pads are covered by the first portion of the contact pad insulating layer, and the second portion of the contact pad insulating layer is located in the region between the plurality of input contact pads and the plurality of output contact pads.

The manufacturing process of the display substrate according to the embodiments of the present disclosure will be described below with reference to FIG. 17A to FIG. 17G in conjunction with the display substrate of FIG. 8A and FIG. 9.

Figure 17A:
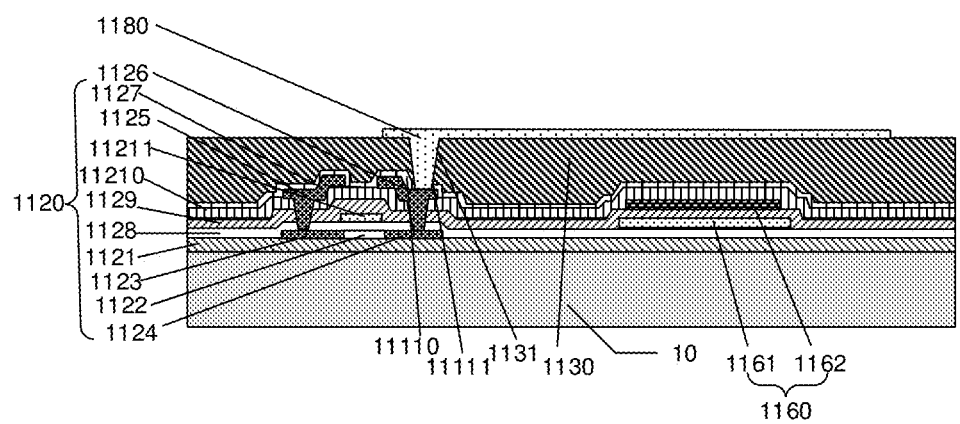
FIG. 17A to FIG. 17G show schematic diagrams of a manufacturing process of a display substrate according to the embodiments of the present disclosure.

As shown in FIG. 17A, the base substrate 10 is provided, and the base substrate 10 includes a display region and a peripheral region located around the display region. The peripheral region includes at least one bonding region located on at least one side of the display region and the side region located on at least another side of the display region. The pixel driving circuit 1120, the storage capacitor 1160, the first planarization layer 1130 and the first transfer electrode 1180 are formed in the display region of the base substrate 10. The first gate insulating layer 1251 of the bonding region, the first lead connection portion 1231, the second gate insulating layer 1252, the interlayer insulating layer 1253 of the bonding region, the first conductor portion 1242, the passivation layer 1254' of the bonding region and the second conductor portion 1243 are formed in the bonding region of the display substrate 10. The second conductor portion 1243 covers the edge of the first conductor portion 1242 to prevent the first conductor portion 1242 from being corroded. In this embodiment, the first conductor portion 1242 and the second conductor portion 1243 are stacked.

Figure 17B:
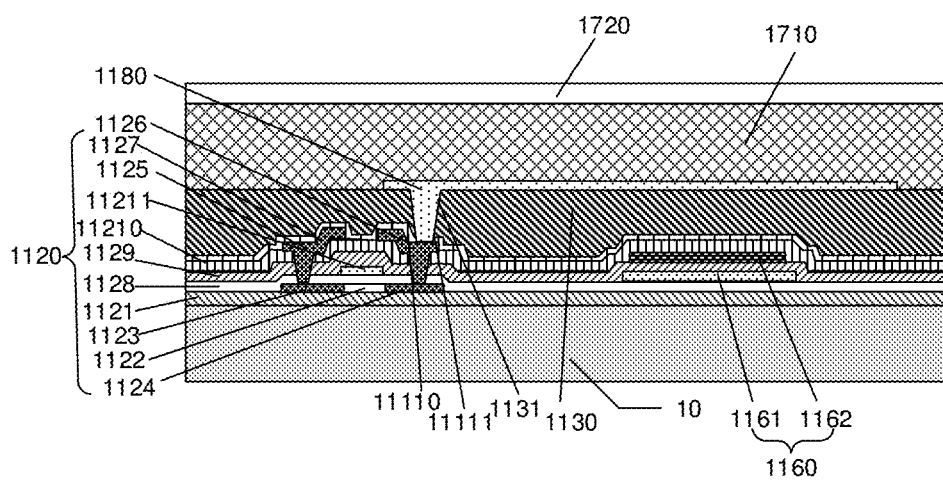
Figure 17B:
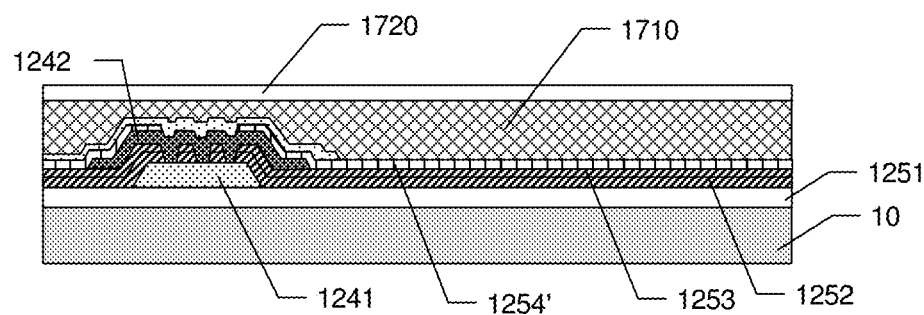

As shown in FIG. 17B, an insulating material layer 1710 is deposited on the base substrate, and a photoresist 1720 is deposited on the insulating material layer 1710. The insulating material layer 1710 may include insulating materials such as silicon oxide, silicon nitride, and silicon oxynitride.

Figure 17C:
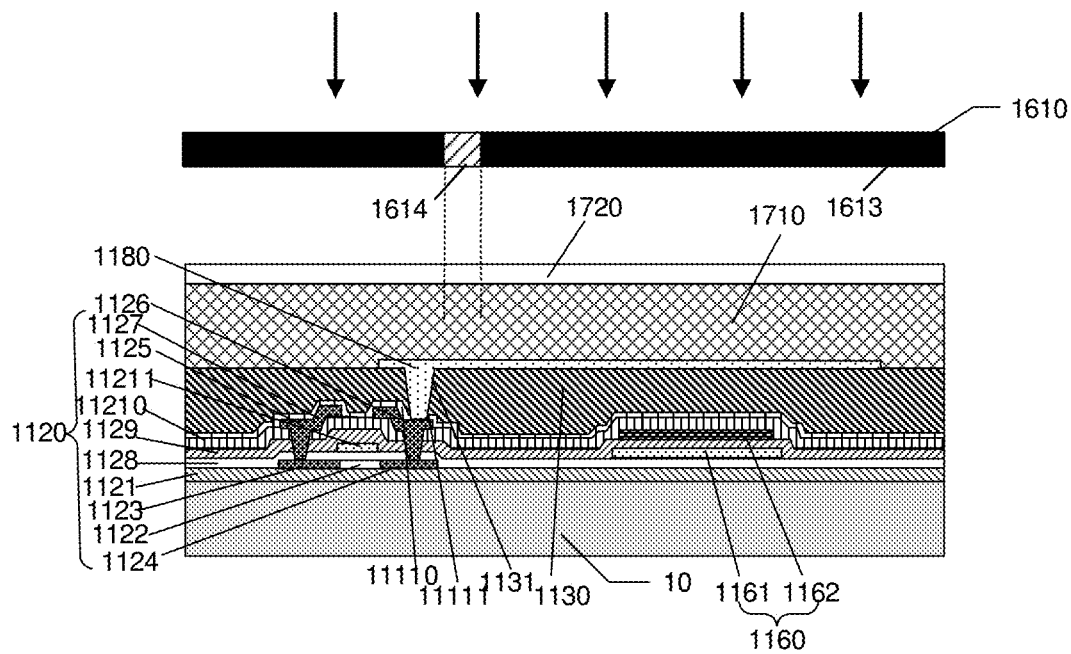
Figure 17C:
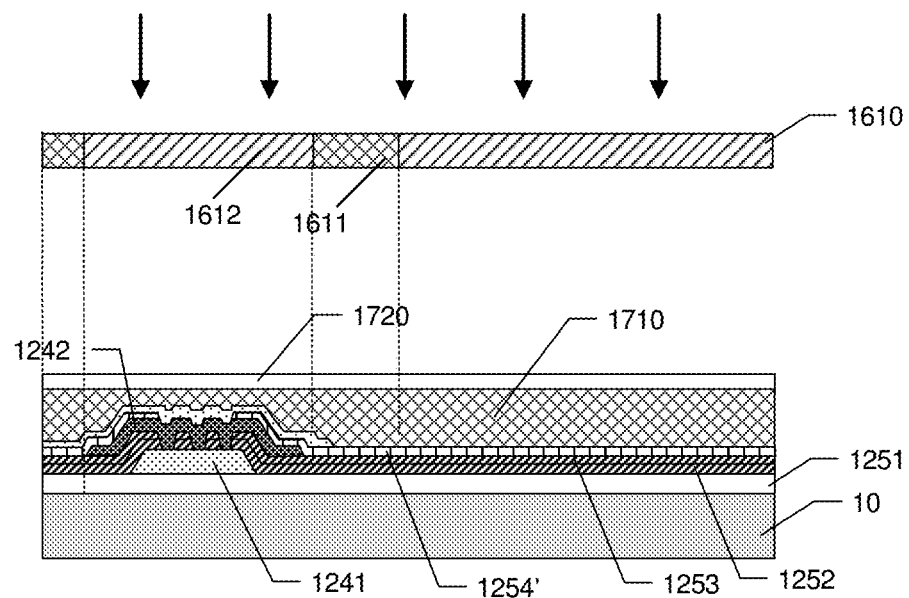

As shown in FIG. 17C, a mask 1610 is provided to expose the photoresist 1720, and the mask 1610 includes a fully light-transmitting region, a partially light-transmitting region and a non-light-transmitting region. The mask 1610 includes a first light-transmitting pattern 1611 overlapping with a region where the second portion 1230B of the contact pad insulating layer 1230 is to be formed and a second light-transmitting pattern 1612 overlapping with the output contact pad P2 in the bonding region. The mask 1610 includes the second light-transmitting pattern 1612 and a non-light-transmitting pattern 1613 in the display region. The first light-transmitting pattern 1611 is located in the partially light-transmitting region, the second light-transmitting pattern 1612 is located in the fully light-transmitting region, and the non-light-transmitting pattern 1613 is located in the non-light-transmitting region. That is, the mask 1610 is a gray mask or a halftone mask. The photoresist is a positive photoresist. Correspondingly, a light transmittance efficiency of the first light-transmitting pattern 1611 is lower than that of the second light-transmitting pattern 1612. During the exposure process, a portion of the photoresist 1720 corresponding to the first light-transmitting pattern 1611 may be partially exposed under a condition that a portion of the photoresist 1720 corresponding to the second light-transmitting pattern 1612 is completely exposed. A portion of the photoresist 1720 corresponding to the non-light-transmitting pattern 1613 in the display region is not exposed.

For another example, in the above patterning process, a negative photoresist may further be used. The used mask is, for example, a mask complementary to the above mask 1610, so that a photoresist pattern 1721 and a photoresist pattern 1722 are obtained after exposure and development.

Figure 17D:
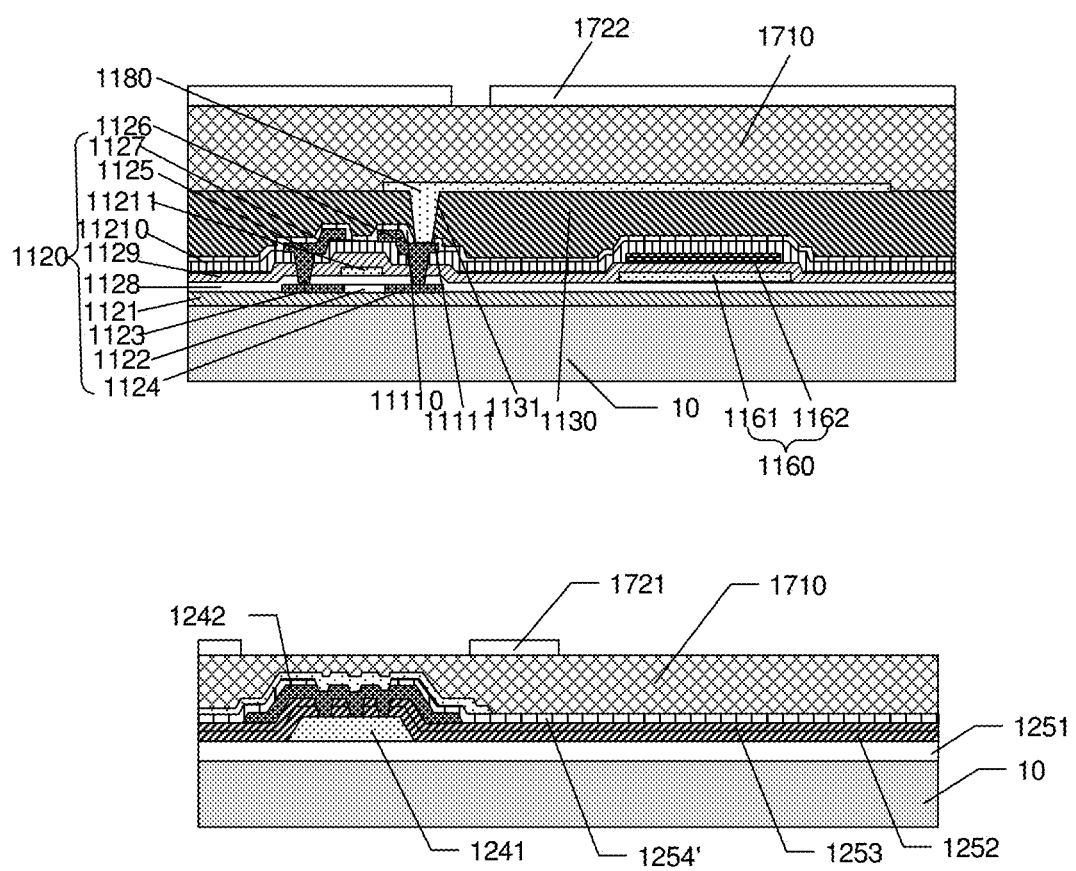

As shown in FIG. 17D, the photoresist 1720 is developed, so that the fully exposed portion of the photoresist 1720 is removed. That is, in the bonding region, the photoresist 1720 that overlaps the output contact pad P2 and a region where the second portion 1230B of the contact pad insulating layer is to be disposed, is removed. The partially exposed portion of the photoresist 1720 is thinned, while a thickness of the unexposed portion of the photoresist 1720 is, for example, substantially unchanged. After development, the photoresist 1720 is formed into the photoresist pattern 1721 in the bonding region. Likewise, in the display region, the photoresist 1720 that overlaps the drain 1126 is removed. After developing, the photoresist 1720 is formed into the photoresist pattern 1722 in the display region.

Figure 17E:
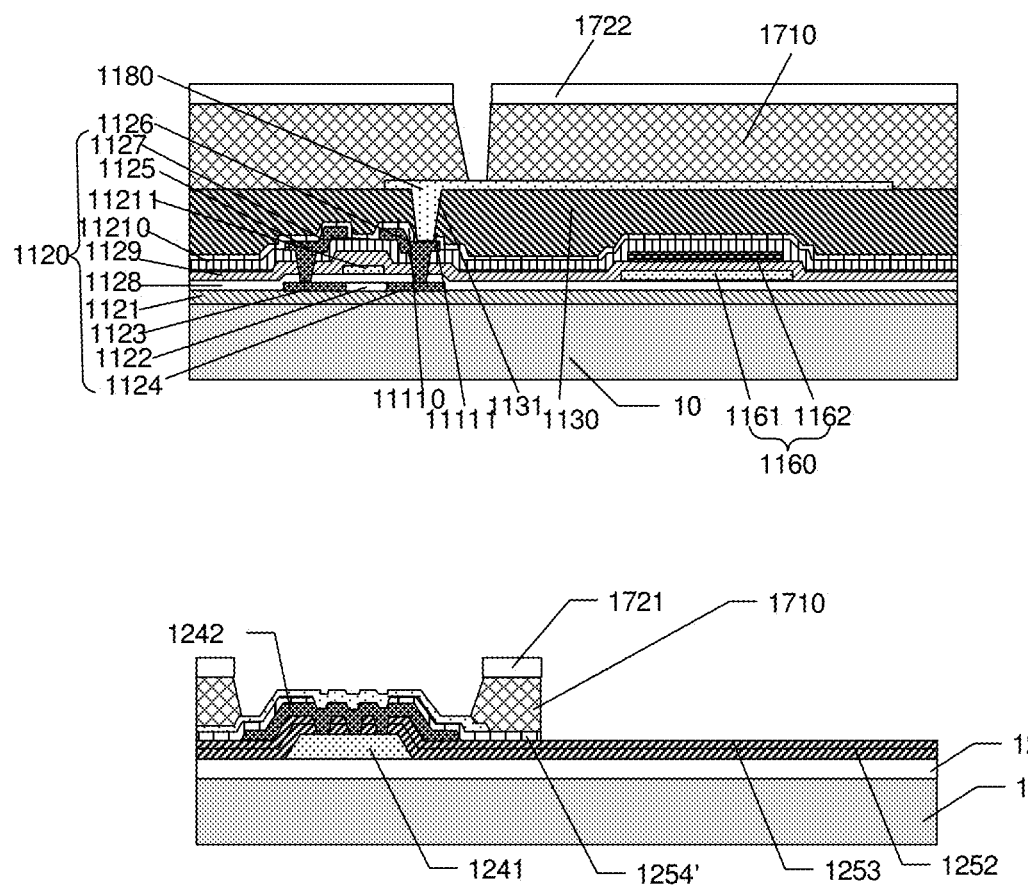

As shown in FIG. 17E, the insulating material layer 1710 in the bonding region and the display region is etched to remove the insulating material layer that overlaps the output contact pads P2 and the region where the second portion 1230B of the contact pad insulating layer is to be disposed, and the second via hole 1191 is formed in the display region.

Figure 17F:
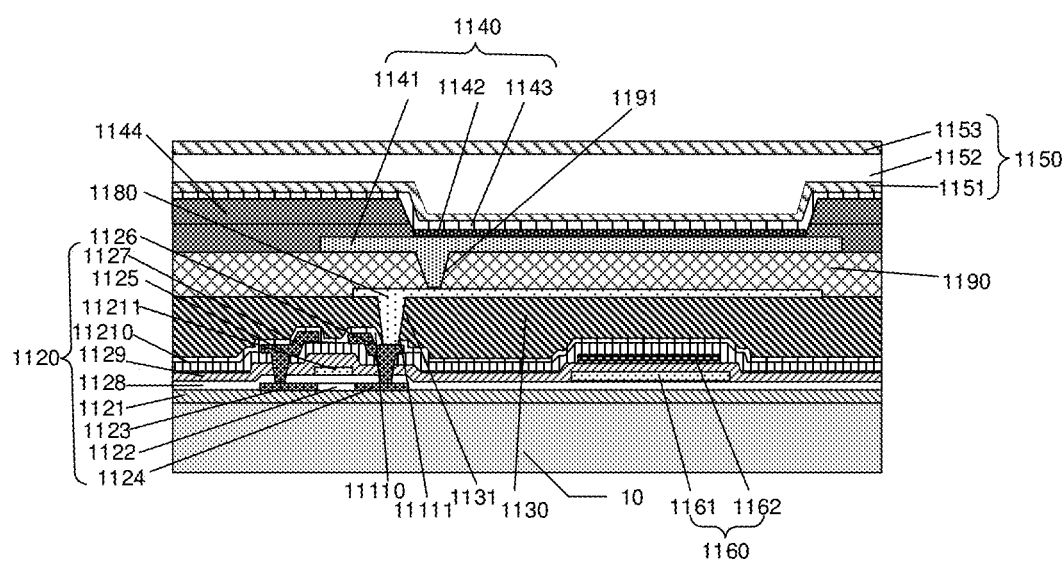
Figure 17F:
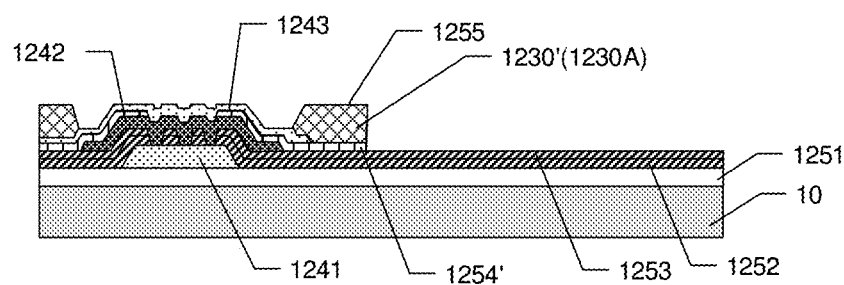

As shown in FIG. 17F, an ashing process is performed to remove the photoresist pattern 1721 in the bonding region and thin the photoresist pattern 1722 in the display region, where the photoresist pattern 1722 in the display region is retained. Then, using a current photoresist pattern, a retained insulating material layer 1710 in the bonding region is etched and an etching thickness is controlled to form the contact pad insulating layer 1230, and the contact pad insulating layer 1230 formed after the etching has the first portion 1230A and the second portion 1230B having a thickness smaller than that of the first portion 1230A. A thickness of the second portion 1230B in FIG. 17F is zero, that is, an insulating material of this portion is removed. This makes a height of the second portion 1230B of the contact pad insulating layer relative to the surface of the base substrate 10 lower than a height of the first portion 1230B relative to the surface of the base substrate 1000. The photoresist pattern 1722 of the display region is removed. The second planarization layer 1190 is formed in the display region to provide the planarization surface. The light-emitting element 1140 is formed on the second planarization 1190 in the display region. The encapsulation layer 1150 is formed on the light-emitting element 1140 in the display region. The encapsulation layer 1150 will seal the light-emitting element 1140, so that deterioration of the light-emitting element 1140 caused by moisture and/or oxygen included in the environment may be reduced or prevented.

Figure 17G:
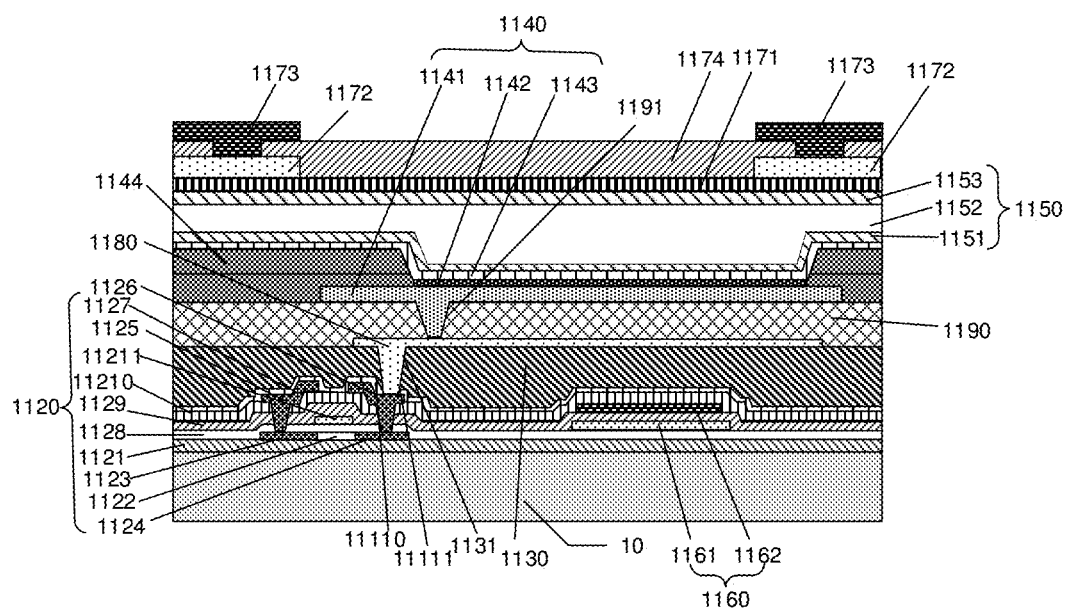
Figure 17G:
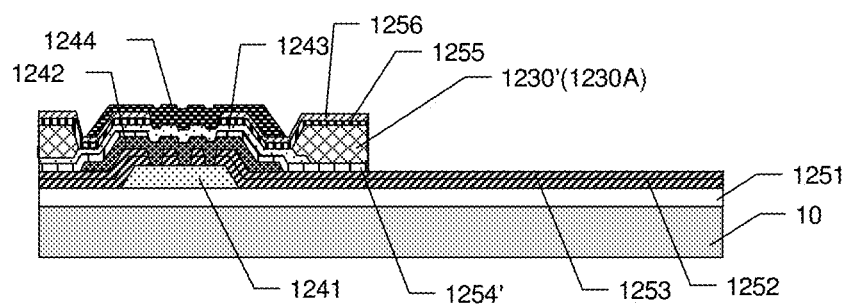

As shown in FIG. 17G, the barrier layer 1171 of the display region is formed on the encapsulation layer 1150 in the display region, and the barrier layer 1255 of the bonding region is formed in the bonding region. Then, the first touch electrode layer 1172 is formed on the barrier layer 1171 of the display region in the display region. The touch insulating layer 1174 is formed on the first touch electrode layer 1172 in the display region, and the inorganic layer 1256 of the bonding region is formed on the barrier layer 1255 of the bonding region in the bonding region. Then, the second touch electrode layer 1173 is formed on the touch insulating layer 1174 in the display region, and the third conductor portion 1244 is formed on the inorganic layer 1256 of the bonding region in the bonding region.

Those skilled in the art may understand that the above-described embodiments are all exemplary. Those skilled in the art may make improvements thereto, and the structures described in the various embodiments may be freely combined in a case that there is no conflict in terms of structure or principle.

After describing the preferred embodiments of the present disclosure in detail, those skilled in the art may clearly understand that various changes and modifications may be made without departing from the scope and spirit of the appended claims, and the present disclosure is not limited to the exemplary embodiments set forth in the specification.

What is claimed is:

1. A display substrate, comprising:
   a base substrate comprising a display region, a bonding region located on at least one side of the display region, and a side region located on at least another side of the display region;
   a plurality of sub-pixels located in the display region;
   a gate driving circuit located in the side region, connected to the plurality of sub-pixels, and configured to provide a gate driving signal to the plurality of sub-pixels;
   a plurality of input contact pads located in the bonding region, and configured to be electrically connected to an external circuit;
   a plurality of output contact pads located in the bonding region between the plurality of input contact pads and the display region, and electrically connected to the plurality of sub-pixels and the gate driving circuit;
   a contact pad insulating layer located in the bonding region within a gap between adjacent input contact pads among the plurality of input contact pads, a gap between adjacent output contact pads among the plurality of output contact pads, and a region between the plurality of input contact pads and the plurality of output contact pads, wherein surfaces of the plurality of input contact pads away from the base substrate and surfaces of the plurality of output contact pads away from the base substrate are exposed from the contact pad insulating layer, wherein the contact pad insulating layer comprises a first portion having a first thickness and a second portion having a second thickness smaller than the first thickness, edges of the plurality of input contact pads and edges of the plurality of output contact pads are covered by the first portion of the contact pad insulating layer, and the second portion of the contact pad insulating layer is located in the region between the plurality of input contact pads and the plurality of output contact pads; and a plurality of first dummy contact pads located in the bonding region within the region between the plurality of input contact pads and the plurality of output contact pads, wherein edges of the plurality of first dummy contact pads are covered by the first portion of the contact pad insulating layer, and surfaces of the plurality of first dummy contact pads away from the base substrate are exposed from the first portion of the contact pad insulating layer; and wherein the second portion of the contact pad insulating layer comprises a first sub-portion and a second sub-portion, the first sub-portion is located in a region between the plurality of first dummy contact pads and the plurality of input contact pads, the second sub-portion is located in a region between the plurality of first dummy contact pads and the plurality of output contact pads.

2. The display substrate according to claim 1, further comprising: a plurality of array test contact pads located in the bonding region within the region between the plurality of first dummy contact pads and the plurality of input contact pads, and electrically connected to the plurality of sub-pixels, wherein the first portion of the contact pad insulating layer comprises a first sub-portion and a second sub-portion, the edges of the plurality of input contact pads, the edges of the plurality of output contact pads and the edges of the first dummy contact pads are covered by the first sub-portion of the first portion of the contact pad insulating layer, edges of the plurality of array test contact pads are covered by the second sub-portion of the first portion of the contact pad insulating layer, and surfaces of the plurality of array test contact pads away from the base substrate are exposed from the first portion of the contact pad insulating layer; and wherein a projection of the second sub-portion of the first portion of the contact pad insulating layer on the base substrate is located within a projection of the first sub-portion of the second portion of the contact pad insulating layer on the base substrate.

3. The display substrate according to claim 1, a projection of each of the plurality of input contact pads and the plurality of output contact pads on the base substrate is spaced from a projection of the second portion of the contact pad insulating layer on the base substrate by a distance of 3 μm to 100 μm.

4. The display substrate according to claim 1, wherein the second thickness is zero.

5. The display substrate according to claim 2, wherein:
the plurality of input contact pads are arranged in at least a first row along a first direction, which is an extension direction of a side edge of the display region facing the bonding region;

the plurality of output contact pads are arranged in at least a second row along the first direction;
the plurality of first dummy contact pads are arranged in at least a third row along the first direction; and
the plurality of array test contact pads are arranged in at least a fourth row along the first direction.

6. The display substrate according to claim 5, further comprising a plurality of second dummy contact pads located in the bonding region and arranged in at least a first column and a second column along a second direction perpendicular to the first direction, wherein the first column and the second column are respectively located on two sides of the plurality of first dummy contact pads in the first direction, wherein edges of the plurality of second dummy contact pads are covered by the first portion of the contact pad insulating layer, and surfaces of the plurality of second dummy contact pads away from the base substrate are exposed from the first portion of the contact pad insulating layer; and wherein a projection of each of the plurality of second dummy contact pads on the base substrate is spaced from a projection of the second portion of the contact pad insulating layer on the base substrate by a distance of 3 μm to 100 μm.

7. The display substrate according to claim 1, wherein at least one of the plurality of input contact pads and the plurality of output contact pads comprises:

a first lead connection portion located on the base substrate, wherein a first lead connection portion of the input contact pad is electrically connected to a connection contact pad for connecting to the external circuit through a first lead disposed in the bonding region, a first lead connection portion of the output contact pad is electrically connected to the gate driving circuit or to at least one of the plurality of sub-pixels through a second lead disposed in the bonding region;

a first conductor portion located on a side of the first lead connection portion away from the base substrate, and electrically connected to the first lead connection portion;

a second conductor portion located on a side of the first conductor portion away from the base substrate, and electrically connected to the first conductor portion, wherein an edge of the second conductor portion is covered by the first portion of the contact pad insulating layer.

8. The display substrate according to claim 7, further comprising:

a first gate insulating layer of the bonding region, wherein the first gate insulating layer of the bonding region is located in the bonding region and covers the base substrate, wherein the first lead connection portion is located on a side of the first gate insulating layer of the bonding region away from the base substrate;

a second gate insulating layer of the bonding region, wherein the second gate insulating layer of the bonding region is located in the bonding region on the side of the first gate insulating layer of the bonding region away from the base substrate, and covers the first lead connection portion;

an interlayer insulating layer of the bonding region, wherein the interlayer insulating layer of the bonding region is located in the bonding region on a side of the second gate insulating layer of the bonding region away from the base substrate, and the first conductor portion is electrically connected to the first lead connection portion through a via hole disposed in the second gate insulating layer of the bonding region and a via hole disposed in the interlayer insulating layer of the bonding region; and
a passivation layer of the bonding region, wherein the passivation layer of the bonding region is located in the bonding region on a side of the interlayer insulating layer of the bonding region away from the base substrate and covers the first conductor portion, and the second conductor portion is electrically connected to the first conductor portion through a via hole disposed in the passivation layer of the bonding region.

9. The display substrate according to claim 8, wherein a thickness of a portion of the passivation layer of the bonding region located between the second portion of the contact pad insulating layer and the second gate insulating layer of the bonding region is greater than or equal to 0.

10. The display substrate according to claim 7, further comprising:
a first gate insulating layer of the bonding region, wherein the first gate insulating layer of the bonding region is located in the bonding region and covers the base substrate, and the first lead connection portion is located on a side of the first gate insulating layer of the bonding region away from the base substrate;
a second gate insulating layer of the bonding region, wherein the second gate insulating layer of the bonding region is located in the bonding region on the side of the first gate insulating layer of the bonding region away from the base substrate, and covers the first lead connection portion;
an interlayer insulating layer of the bonding region, wherein the interlayer insulating layer of the bonding region is located in the bonding region on a side of the second gate insulating layer of the bonding region away from the base substrate, the first conductor portion is electrically connected to the first lead connection portion through a via hole disposed in the second gate insulating layer of the bonding region and a via hole disposed in the interlayer insulating layer of the bonding region, and the second conductor portion is located on the side of the first conductor portion away from the base substrate and covers the first conductor portion.

11. The display substrate according to claim 7, wherein the at least one of the plurality of input contact pads and the plurality of output contact pads further comprises:
a third conductor portion located on a side of the second conductor portion away from the base substrate, and electrically connected to the second conductor portion, wherein the display substrate further comprising:
a barrier layer of the bonding region, wherein the barrier layer of the bonding region is located in the bonding region, and covers the second conductor portion and the first portion of the contact pad insulating layer, and
an inorganic layer of the bonding region, wherein the inorganic layer of the bonding region is located in the bonding region and covers the barrier layer of the bonding region, and the third conductor portion is electrically connected to the second conductor portion through a via hole disposed in the barrier layer of the bonding region and a via hole disposed in the inorganic layer of the bonding region.

12. The display substrate according to claim 1, wherein at least one of the plurality of first dummy contact pads comprises a fourth conductor portion, the fourth conductor portion is located on a side of the base substrate facing the plurality of input contact pads and the plurality of output contact pads, and an edge of the fourth conductor portion is covered by the first portion of the contact pad insulating layer,
wherein at least one of the plurality of input contact pads and the plurality of output contact pads comprises a first lead connection portion, a first conductor portion and a second conductor portion, and the fourth conductor portion is disposed in the same layer as the second conductor portion.

13. The display substrate according to claim 12, wherein the at least one of the plurality of first dummy contact pads further comprises a fifth conductor portion, the fifth conductor portion is located between the fourth conductor portion and the base substrate and is electrically connected to the fourth conductor portion, and the fifth conductor portion is disposed in the same layer as the first conductor portion.

14. The display substrate according to claim 2, wherein at least one of the plurality of array test contact pads comprises:
a second lead connection portion located on a side of the base substrate facing the plurality of input contact pads and the plurality of output contact pads;
a sixth conductor portion located on a side of the second lead connection portion away from the base substrate, and electrically connected to the second lead connection portion; and
a seventh conductor portion located on a side of the sixth conductor portion away from the base substrate, and electrically connected to the sixth conductor portion, wherein an edge of the seventh conductor portion is covered by the first portion of the contact pad insulating layer,
wherein at least one of the plurality of input contact pads and the plurality of output contact pads comprises a first lead connection portion, a first conductor portion and a second conductor portion, the second lead connection portion is disposed in the same layer as the first lead connection portion, the sixth conductor portion is disposed in the same layer as the first conductor portion, and the seventh conductor portion is disposed in the same layer as the second conductor portion.

15. The display substrate according to claim 6, wherein at least one of the plurality of second dummy contact pads comprises an eighth conductor portion, the eighth conductor portion is located on a side of the base substrate facing the plurality of input contact pads and the plurality of output contact pads, and an edge of the eighth conductor portion is covered by the first portion of the contact pad insulating layer,
wherein at least one of the plurality of input contact pads and the plurality of output contact pads comprises a first lead connection portion, a first conductor portion and a second conductor portion, and the eighth conductor portion is disposed in the same layer as the second conductor portion;
wherein the at least one of the plurality of second dummy contact pads further comprises a ninth conductor portion, the ninth conductor portion is located between the eighth conductor portion and the base substrate and is electrically connected to the eighth conductor portion, and the ninth conductor portion is disposed in the same layer as the first conductor portion.

16. The display substrate according to claim 1, wherein at least one of the plurality of sub-pixels comprises a pixel driving circuit, a first planarization layer, a first transfer electrode, a second planarization layer and a light-emitting element, wherein:
- the first planarization layer is located on a side of the pixel driving circuit away from the base substrate to provide a first planarization surface;
- the first transfer electrode is located on the first planarization surface, and is electrically connected to the pixel driving circuit through a via hole disposed in the first planarization layer;
- the second planarization layer is located on a side of the first transfer electrode away from the base substrate to provide a second planarization surface; and
- the light-emitting element is located on the second planarization surface, and is electrically connected to the first transfer electrode through a via hole disposed in the second planarization layer;
- wherein the contact pad insulating layer is disposed in the same layer as the second planarization layer.

17. The display substrate according to claim 16, wherein the pixel driving circuit comprises a thin film transistor having a gate, a source and a drain, at least one of the plurality of input contact pads and the plurality of output contact pads comprises a first lead connection portion, a first conductor portion and a second conductor portion, wherein:
- the first lead connection portion is disposed in the same layer as the gate;
- the first conductor portion is disposed in the same layer as the source and the drain; and
- the second conductor portion is disposed in the same layer as the first transfer electrode;
- wherein the display substrate, further comprising:
- a passivation layer of the display region, wherein the passivation layer of the display region is located between the pixel driving circuit and the first planarization layer, and the pixel driving circuit is further electrically connected to the first transfer electrode through a via hole disposed in the passivation layer of the display region; and
- a passivation layer of the bonding region, wherein the passivation layer of the bonding region is disposed in the same layer as the passivation layer of the display region;
- wherein the display substrate, further comprising:
- an encapsulation layer, a barrier layer of the display region, a first touch electrode layer, a second touch electrode layer and a touch insulating layer that are located in the display region, the encapsulation layer is located on a side of the light-emitting element away from the base substrate, the barrier layer of the display region is located on a side of the encapsulation layer away from the base substrate, the first touch electrode layer is located on a side of the barrier layer of the display region away from the base substrate, the touch insulating layer is located on a side of the first touch electrode layer away from the base substrate and covers the first touch electrode layer, and the second touch electrode layer is located on a side of the touch insulating layer away from the base substrate; and a barrier layer of the bonding region and an inorganic layer of the bonding region that are located in the bonding region, wherein at least one of the plurality of input contact pads and the plurality of output contact pads further comprises a third conductor portion, the barrier layer of the bonding region is located in the same layer as the barrier layer of the display region, the inorganic layer of the bonding region is located in the same layer as the touch insulating layer, and the third conductor portion is located in the same layer as the second touch electrode layer.

18. The display substrate according to claim 17, wherein the at least one of the plurality of sub-pixels further comprises an interlayer insulating layer of the display region, a first gate insulating layer of the display region and a second gate insulating layer of the display region, the interlayer insulating layer of the display region is located between the gate and the source and drain, the first gate insulating layer of the display region is located on a side of the interlayer insulating layer of the display region facing the base substrate, and the second gate insulating layer of the display region is located between the interlayer insulating layer of the display region and the first gate insulating layer of the display region;
- wherein the display substrate further comprises an interlayer insulating layer of the bonding region, a first gate insulating layer of the bonding region, and a second gate insulating layer of the bonding region; and
- wherein the interlayer insulating layer of the bonding region is disposed in the same layer as the interlayer insulating layer of the display region, the first gate insulating layer of the bonding region is disposed in the same layer as the first gate insulating layer of the display region, and the second gate insulating layer of the bonding region is disposed in the same layer as the second gate insulating layer of the display region;
- wherein the at least one of the plurality of sub-pixels further comprises a storage capacitor, a first electrode of the storage capacitor is disposed in the same layer as the gate, and a second electrode of the storage capacitor is disposed between the interlayer insulating layer of the display region and the second gate insulating layer of the display region;
- wherein the base substrate comprises:
- a first flexible layer,
- a second flexible layer located on a side of the first flexible layer facing the plurality of input contact pads and the plurality of output contact pads;
- a first substrate barrier layer located between the first flexible layer and the second flexible layer;
- a second substrate barrier layer located on a side of the second flexible layer away from the first flexible layer; and
- a buffer layer located on a side of the second substrate barrier layer away from the first flexible layer.

19. A display device, comprising the display substrate according to claim 1.

* * * * *